United States Patent
Okada et al.

(10) Patent No.: US 9,686,886 B2
(45) Date of Patent: Jun. 20, 2017

(54) COOLING MECHANISM OF STORAGE CONTROL APPARATUS

(71) Applicant: Hitachi, Ltd., Tokyo (JP)

(72) Inventors: Naoki Okada, Tokyo (JP); Toshio Asai, Kanagawa (JP); Hiroshi Suzuki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 42 days.

(21) Appl. No.: 14/769,200

(22) PCT Filed: Dec. 11, 2013

(86) PCT No.: PCT/JP2013/083237
§ 371 (c)(1),
(2) Date: Aug. 20, 2015

(87) PCT Pub. No.: WO2015/087418
PCT Pub. Date: Jun. 18, 2015

(65) Prior Publication Data
US 2015/0382503 A1    Dec. 31, 2015

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *H05K 7/20718* (2013.01); *H05K 7/20727* (2013.01)

(58) Field of Classification Search
CPC .. G06F 1/20; H05K 7/20145; H05K 7/20718; H05K 7/20727

USPC ............. 361/679.46–679.54, 688–723; 165/80.1–80.1; 454/186, 188–193, 454/228–236
See application file for complete search history.

(56) References Cited

U.S. PATENT DOCUMENTS

| | | | | |
|---|---|---|---|---|
| 6,388,879 | B1* | 5/2002 | Otaguro | G02B 6/43 361/695 |
| 6,950,263 | B2* | 9/2005 | Suzuki | G06F 1/184 360/69 |
| 8,064,200 | B1* | 11/2011 | West | H05K 7/20563 361/694 |
| 2004/0252456 | A1* | 12/2004 | Larson | G06F 1/20 361/694 |
| 2005/0207134 | A1* | 9/2005 | Belady | H05K 1/14 361/796 |

(Continued)

FOREIGN PATENT DOCUMENTS

| | | | |
|---|---|---|---|
| JP | 2001-356841 A | 12/2001 | |
| JP | 2001356841 A | * 12/2001 | ............... H05K 7/20 |

(Continued)

OTHER PUBLICATIONS

International Search Report of PCT/JP2013/083237.

*Primary Examiner* — Anthony Haughton
*Assistant Examiner* — Yahya Ahmad
(74) *Attorney, Agent, or Firm* — Mattingly & Malur, PC

(57) ABSTRACT

A cooling mechanism includes a plurality of first circuit boards arranged in parallel with each other, one or more first fans for generating a cooling wind in a first flow path formed along the plurality of first circuit boards, and a connection board arranged orthogonally to the first flow path and at a position different from a position of the first flow path, and coupling the plurality of first circuit boards.

14 Claims, 21 Drawing Sheets

(56) References Cited

U.S. PATENT DOCUMENTS

| | | | |
|---|---|---|---|
| 2006/0126292 A1* | 6/2006 | Pfahnl | H05K 7/20563 361/695 |
| 2007/0006239 A1* | 1/2007 | Kasahara | G06F 1/20 720/601 |
| 2008/0148303 A1* | 6/2008 | Okamoto | G11B 33/126 720/652 |
| 2010/0053879 A1* | 3/2010 | Miyamoto | G11B 33/128 361/679.31 |
| 2012/0327597 A1* | 12/2012 | Liu | H05K 7/20736 361/692 |
| 2014/0138069 A1* | 5/2014 | Hao | H05K 7/20554 165/121 |
| 2015/0355690 A1* | 12/2015 | Baba | G06F 1/20 361/692 |

FOREIGN PATENT DOCUMENTS

| | | |
|---|---|---|
| JP | 2002-026548 A | 1/2002 |
| JP | 2011-249731 A | 12/2011 |

* cited by examiner

Fig. 9

Temperature management table 90

| FAN number | Rotation number | Logic board number | Sensor number | Temperature information | Mounting information | Lock-out information |
|---|---|---|---|---|---|---|
| a | AA/rpm | A1 | A1 | 25°C | 1 | 0 |
| | | A2 | A2 | 25°C | 1 | 0 |
| | | A3 | A3 | 28°C | 1 | 0 |
| | | — | — | — | 0 | — |
| | | — | — | — | 0 | — |
| | | An | An | 25°C | 1 | 0 |
| b | BB/rpm | B1 | B1 | 120°C | 1 | 0 |
| | | B2 | B2 | 140°C | 1 | 0 |
| | | B3 | B3 | 120°C | 1 | 0 |
| | | B4 | B4 | — | 1 | 1 |
| | | B5 | B5 | — | 1 | 1 |
| | | Bn | Bn | 100°C | 1 | 0 |

Fig. 16

| FAN number (1601) | Rotation number (1602) | Logic board number (1603) | Sensor number (1604) | Temperature information (1605) | Mounting information (1606) | Lock-out information (1607) |
|---|---|---|---|---|---|---|
| a1 | aa/rpm | A1 | A1 | 25°C | 1 | 0 |
| a2 | ab/rpm | A2 | A2 | 25°C | 1 | 0 |
| ... | ... | A3 | A3 | 28°C | 1 | 0 |
| ... | ... | ... | ... | ... | ... | ... |
| an | an/rpm | ... | ... | ... | ... | ... |
| b1 | bb/rpm | An | An | 28°C | 1 | 0 |
| b2 | bc/rpm | B1 | B1 | 25°C | 1 | 0 |
| ... | ... | B2 | B2 | 25°C | 1 | 0 |
| ... | ... | B3 | B3 | 28°C | 1 | 0 |
| bn | bn/rpm | ... | ... | ... | ... | ... |
| | | ... | ... | ... | ... | ... |
| | | Bn | Bn | 28°C | 1 | 0 |

160

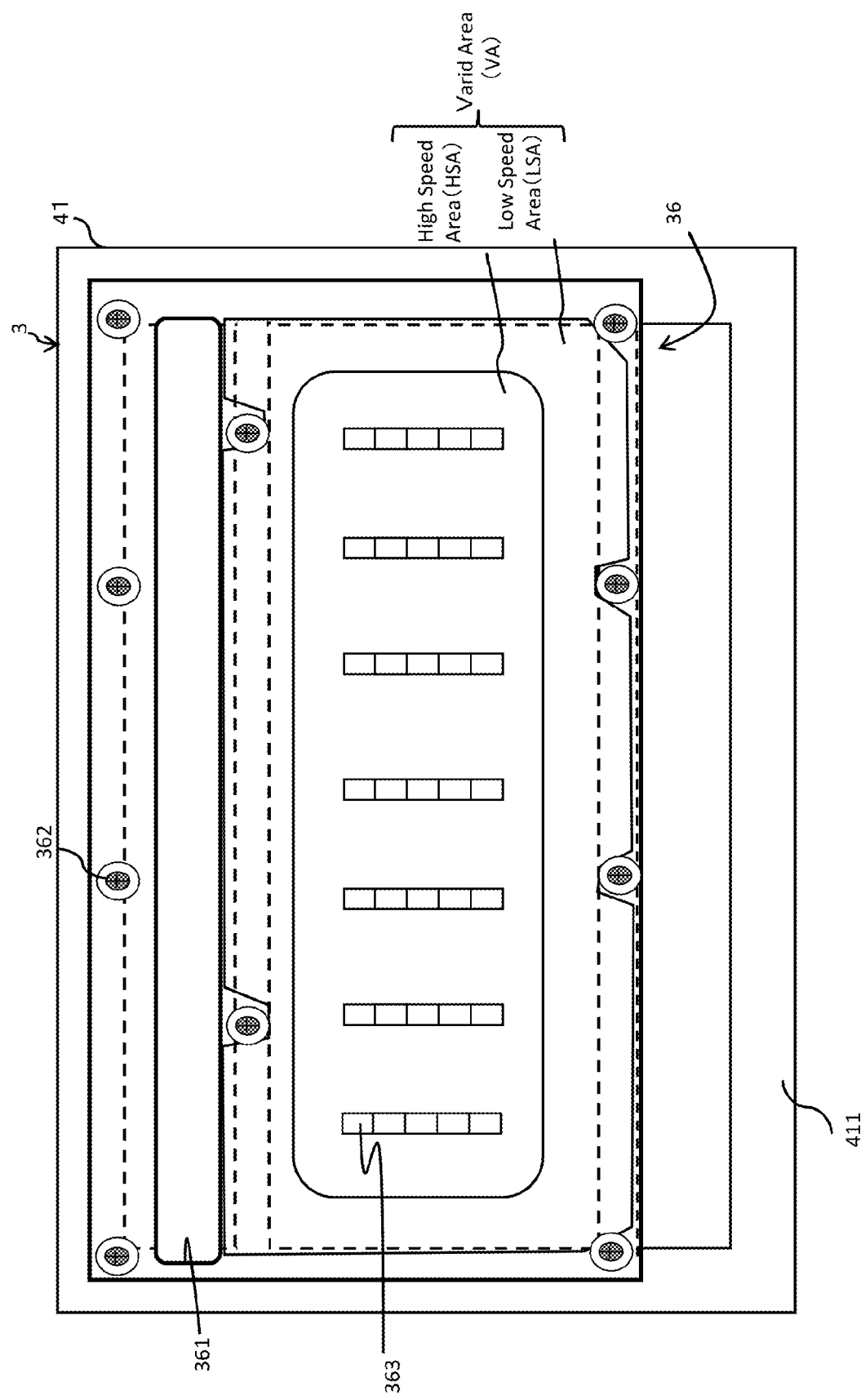

COOLING MECHANISM OF STORAGE CONTROL APPARATUS

TECHNICAL FIELD

This invention relates to a technique for cooling a storage control apparatus.

BACKGROUND ART

A cooling mechanism of a plurality of circuit boards (printed boards) is disclosed in, for example, Japanese Patent Laid-open Application No. 2011-249731.

According to the cooling mechanism, the circuit board is arranged in parallel with a flow path of a cooling wind for efficiently cooling the circuit board. In a case where a connection board (back-plane) for coupling the circuit board is arranged orthogonally to the flow path (for example, FIG. 2), the connection board closes the flow path of the cooling wind, and there is a concern of preventing the circuit board from being cooled. Consequently, a wind opening is provided at the connection board.

CITATION LIST

Patent Literature

[PTL 1]
Japanese Patent Application Laid-open No. 2011-249731

SUMMARY OF INVENTION

Technical Problem

However, a flow rate of the cooling window is restricted, and cooling of the circuit board is not sufficient by only providing the wind opening at the connection board. Particularly, in recent years, a heat generating amount of the circuit board is increased year by year in accordance with a downsized configuration and a high performance configuration of apart attached to the circuit board, and sufficient cooling is needed for the circuit board.

Solution to Problem

In order to resolve the problem, a cooling mechanism which is one mode of the present invention includes a plurality of first circuit boards arranged in parallel with each other, one or more first fans for generating a cooling wind in a first flow path formed along the plurality of first circuit boards, and a connection board arranged orthogonally to the first flow path and at a position different from a position of the first flow path, and coupling the plurality of first circuit boards.

Advantageous Effects of Invention

According to one mode of the invention, a cooling efficiency of a circuit board can be increased.

BRIEF DESCRIPTION OF DRAWINGS

FIG. 9 shows a temperature management table of Example 1.
FIG. 11 is a flowchart of a rotation control processing operation of a fan a.
FIG. 16 shows a temperature management table of Example 2.
FIG. 21 is a view for explaining a wiring portion of a back-plane of Example 4.

DESCRIPTION OF EMBODIMENTS

Figure 1:
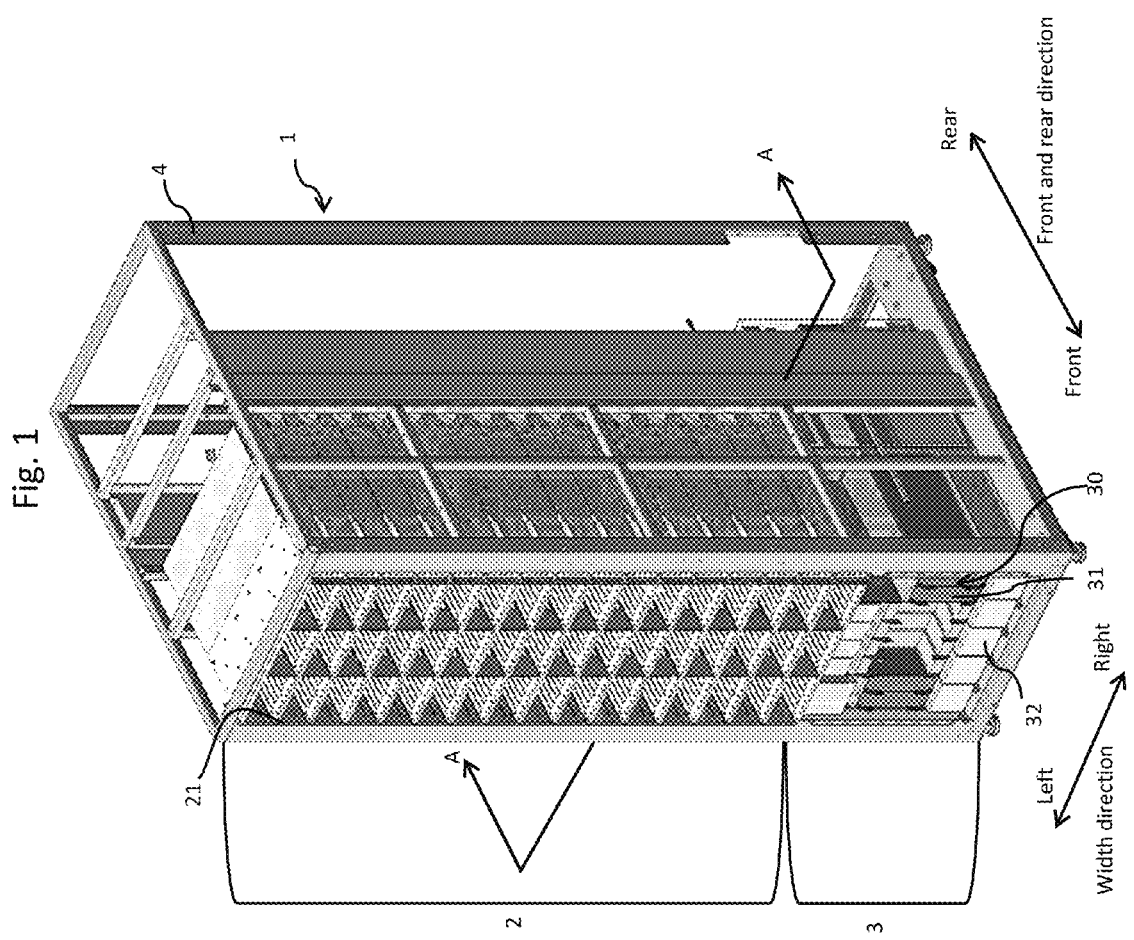
FIG. 1 is a perspective view of a storage system including a storage control apparatus according to Example 1.

Incidentally, although in the following explanation, a piece of information will be explained by an expression of "aaa table" or the like, the piece of information may be expressed by other than a data structure of a table or the like.

Further, although expressions of "identifier", and "number" will be used when a content of each piece of information is explained, the expressions can be substituted for each other.

An element common to respective drawings will be explained by attaching the same reference numeral. Also, concerning a common element, in a case of identifying respective elements, an explanation will be given by attaching individual numbers or the like of la, #1A or the like at a last portion of the numeral. However, there is a case where an explanation is given by omitting the number or the like as necessary.

An explanation will be given of a number of examples of this invention by using drawings or the like as follows. The following examples show specific examples of a content of this invention, this invention is not limited to the examples, but can be changed or modified variously by the skilled person within the range of technical thought disclosed in the specification. For example, in the following explanation, a cooling mechanism according to this invention is explained as a cooling mechanism of a storage control apparatus. However, this invention is not limited thereto.

Example 1

A storage control apparatus of Example 1 will be explained as follows.

FIG. 1 is a perspective view of a storage system including the storage control apparatus of Example 1.

The storage system 1 is constructed by combining a plurality of modules. As the modules, for example, there are a storage module 2 mounted with a storage apparatus, and a logic module 3 for controlling the storage module 2. The storage control apparatus according to the example corresponds to the logic module 3. The storage system 1 is constructed as, for example, one or more aggregates of enclosures 4 mounted with plural kinds of the modules 2 and 3.

According to the example, the storage system 1 is configured by the storage module 2 and the logic module 3 mounted to the enclosure 4. The logic module 3 is mounted to a lower portion of the enclosure 4. The storage module 2 is mounted to an upper portion of the enclosure 4, that is, on an upper side of the logic module 3. Incidentally, an arrangement of the respective modules of the storage system 1 is not limited thereto. For example, the logic module 3 and the storage module 2 may be arranged at inverse positions. Also, the plurality of storage modules 2 and the plurality of logic module 3 may be mounted to the single enclosure 4.

The enclosure 4 is constructed by a structure integrated by frames. Although according to the example, the enclosure 4 is constructed by the single structure configured only by the frames, the invention is not limited thereto. For example, the enclosure 4 may be constructed by a structure in which an upper face, a lower face, and both side faces thereof are closed and a front face and a rear face thereof are opened. The enclosure 4 can include a door which completely covers the front face and/or the rear face at the front face and/or the rear face. The door of the enclosure 4 can be provided with an air passing portion for sucking air from outside to inside of the storage system 1, or exhausting air from inside to outside of the storage system 1. The air passing portion is configured by, for example, a number of holes.

Also, for example, the enclosure 4 may be configured to surround respective portions or totals of the storage module 2 and the logic module 3. In this case, the enclosure 4 may be constructed by a structure in which the upper face, the lower face, and the both side faces of each module are closed and the front face and the rear face of the each module are opened. Incidentally, according to the example, for simplicity, respective elements of the storage module 2 and the logic module 3 are shown only at an area of a front half portion of the enclosure 4.

A plurality of storage boxes 21 mounted with a plurality of storage apparatuses are arranged in the storage module 2. The storage apparatus may be, for example, a hard disk device of an SAS (Serial Attached Small Computer System Interface)-HDD (Hard Disk Drive), an SATA (Serial Advanced Technology Attachment)-HDD or the like, or may be a semiconductor storage device of an SSD (Solid State Drive) or the like.

The logic module 3 is mounted with a plurality of logic boards 31. The logic board 31 is a circuit board integrated with a plurality of logic circuits. There are a number of kinds of the logic boards 31. As the kinds of the logic boards 31, there are, for example, a microprocessor (MP), a switch (SW), a cache memory (CM), a disk adapter (DKA), a channel adapter (CHA) and the like. The logic board 31 maybe of a size which differs by respective kinds thereof, for example, as shown in FIG. 1. The logic module 3 is mounted with a fan 32 for cooling the logic board 31.

Figure 2:
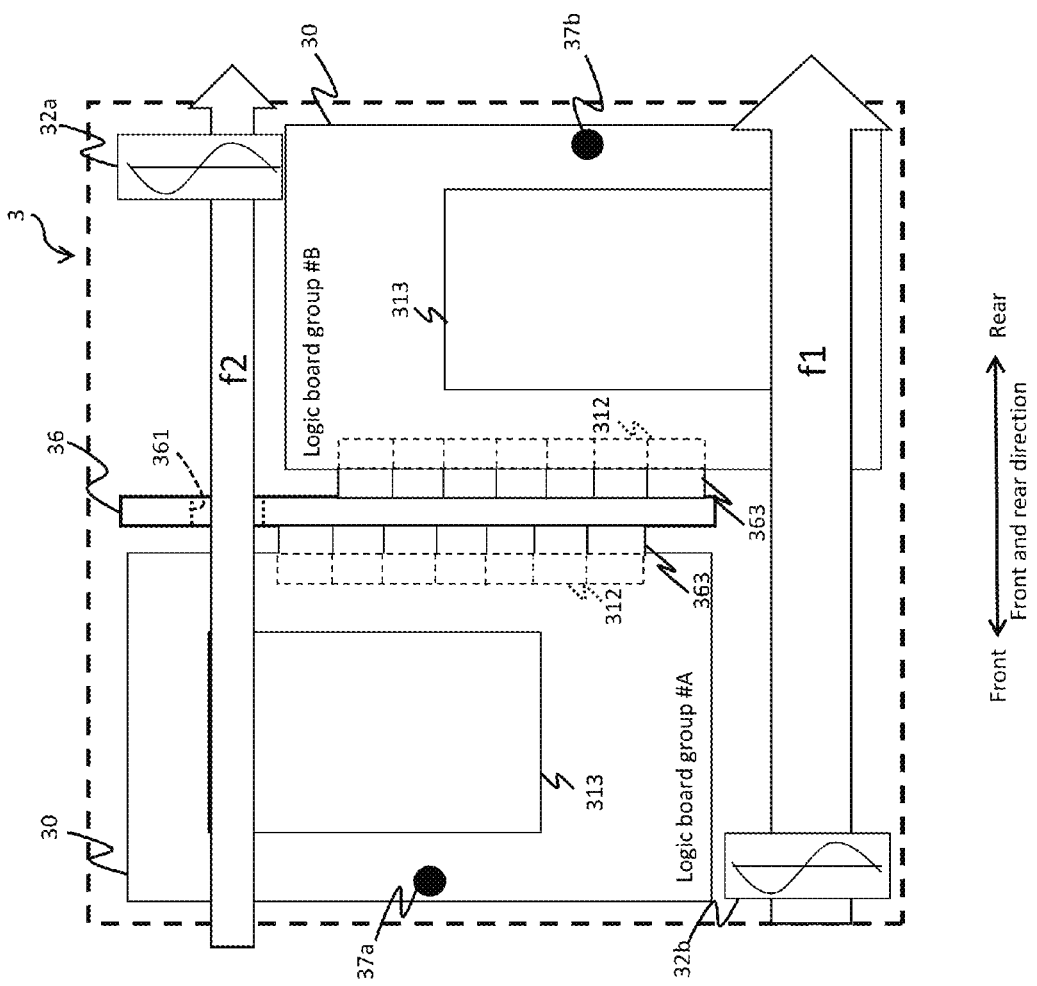
FIG. 2 is a right side view of a logic module of FIG. 1.

FIG. 2 is a right side view of the logic module 3 of FIG. 1.

In the drawing, constituent elements are schematically shown for explaining a cooling mechanism of the logic module 3. An outer shape of the logic module 3 is indicated by dotted lines. A front side and a rear side of the logic module 3 are arranged with logic board groups 30 respectively comprising the plurality of logic boards 31. Although according to the example, respective ones of the two logic board groups 30 are arranged at front and rear areas of the logic module 3, the example is not limited thereto. One or more logic board groups 30 may be arranged at each area. The logic board groups 30 of the respective areas are arranged to shift from each other in an up and down direction. Although according to the example, the logic board group #A of the front area is arranged to be placed to an upper side, and the logic board group #B of the rear area is arranged to be placed to a lower side, the example is not limited thereto.

A fan 32b is arranged on a lower side of the logic board group #A. For example, the fan 32b is a fan of blowing a cooling wind to a flow path f1. The fan 32b is arranged on a front side of the logic board group #B. Thereby, the flow path f1 is formed along the plurality of logic boards 31 of the logic board group #B. That is, the flow path f1 is a lower space positioned on a rear side of the fan 32b in a space in the logic module 3. The lower space includes spaces among the plurality of logic board 31 of the logic board group #B and spaces in contact with the logic board group #B. Incidentally, according to the example, the plurality of fans 32b face the flow path f1, and are provided side by side in parallel with a direction of aligning the plurality of logic boards 31 configuring the logic board group #A (refer to FIG. 3).

The respective logic boards 31 configuring the logic board group #A respectively include parts 313. Details of the part 313 will be described later. One or more temperature sensors 37a are provided on upper sides of the logic boards 31 in the logic board group #A and on front sides of the parts 313. The temperature sensor 37a may be installed, for example, at one or more arbitrary logic boards 31 in the plurality of logic boards 31 configuring the logic board group #A, or may be respectively installed at all of the logic boards 31. A temperature of air flowing into the logic module 3 can be measured by the temperature sensor 37a.

A fan 32a is arranged on an upper side of the logic board group #B. For example, the fan 32a is a fan of sucking a cooling wind from a flow path f2. The fan 32a is arranged on a rear side of the logic board #A. Thereby, the flow path f2 is formed along the logic board group #A on an upper side of the flow path f1. That is, the flow path f2 is an upper space positioned on a front side of the fan 32a in the space in the logic module. The upper space includes spaces among the plurality of logic boards 31 of the logic board group #A and spaces in contact with the logic board group #A. Incidentally, according to the example, the plurality of fans 32a face the flow path f2 and are provided side by side in parallel with an aligning direction of the plurality of logic boards 31 configuring the logic board group #B (not illustrated).

The respective logic boards 31 configuring the logic board group #B respectively include the parts 313. Details of the part 313 will be described later. One or more temperature sensors 37b are provided on upper sides of the logic boards 31 in the logic board group #B and on rear sides of the parts 313. Specifically, for example, the temperature sensor 37b may be provided, for example, at one or more arbitrary logic boards 31 in the plurality of logic boards 31 configuring the logic board group #B, or may respectively be provided at all of the logic boards 31. A temperature of air flowing out from the logic module 3 can be measured by the temperature sensor 37b. Also, the one flow path f1 (f2) corresponds to the one logic board group #A (#B), and therefore, a heat generating temperature (heat generating amount) of the logic board group #B can be estimated by subtracting a measured value of the temperature sensor 37a from a measured value of the temperature sensor 37b.

The logic module 3 is provided with a back-plane 36 orthogonally to the flow paths f1 and f2. For example, the back-plane 36 is a circuit board applied with a printed wiring portion for electrically coupling the plurality of logic boards 31 of the logic board group #A and electrically coupling the plurality of logic boards 31 of the logic board group #B. For example, the back-plane 36 includes a connector 363 at a front face thereof, and is coupled to a connector 312 provided at a rear end of the logic board 31. Similarly, the back-plane 36 includes the connector 363 at a rear face thereof and is coupled to the connector 312 provided at a front end of the logic board 31. That is, the logic board 31 configuring the logic board group #A is arranged on an opposite side of the back-plane 36 to the logic board 31 configuring the logic board group #B.

The back-plane 36 is arranged on an upper side of the flow path f1. In other words, the back-plane 36 is configured by excluding an area on a rear side of the fan 32b. In an illustrated example, the back-plane 36 is configured by keeping away from the flow path f1 on a lower side thereof. Thereby, the flow path f1 is configured from a front end over to a rear end of the logic module 3 without being hindered by the back-plane 36. The back-plane 36 is configured with an air hole 361. The flow path f2 is configured from the front end over to the rear end of the logic module 3 although the flow path f2 is made to be slenderer than the flow path f1 by the air hole 361. Consequently, a cross section of the flow path f1 orthogonal to a flow direction thereof is formed to be wider than a cross section of the flow path f2 orthogonal to a flow direction thereof.

Figure 3:
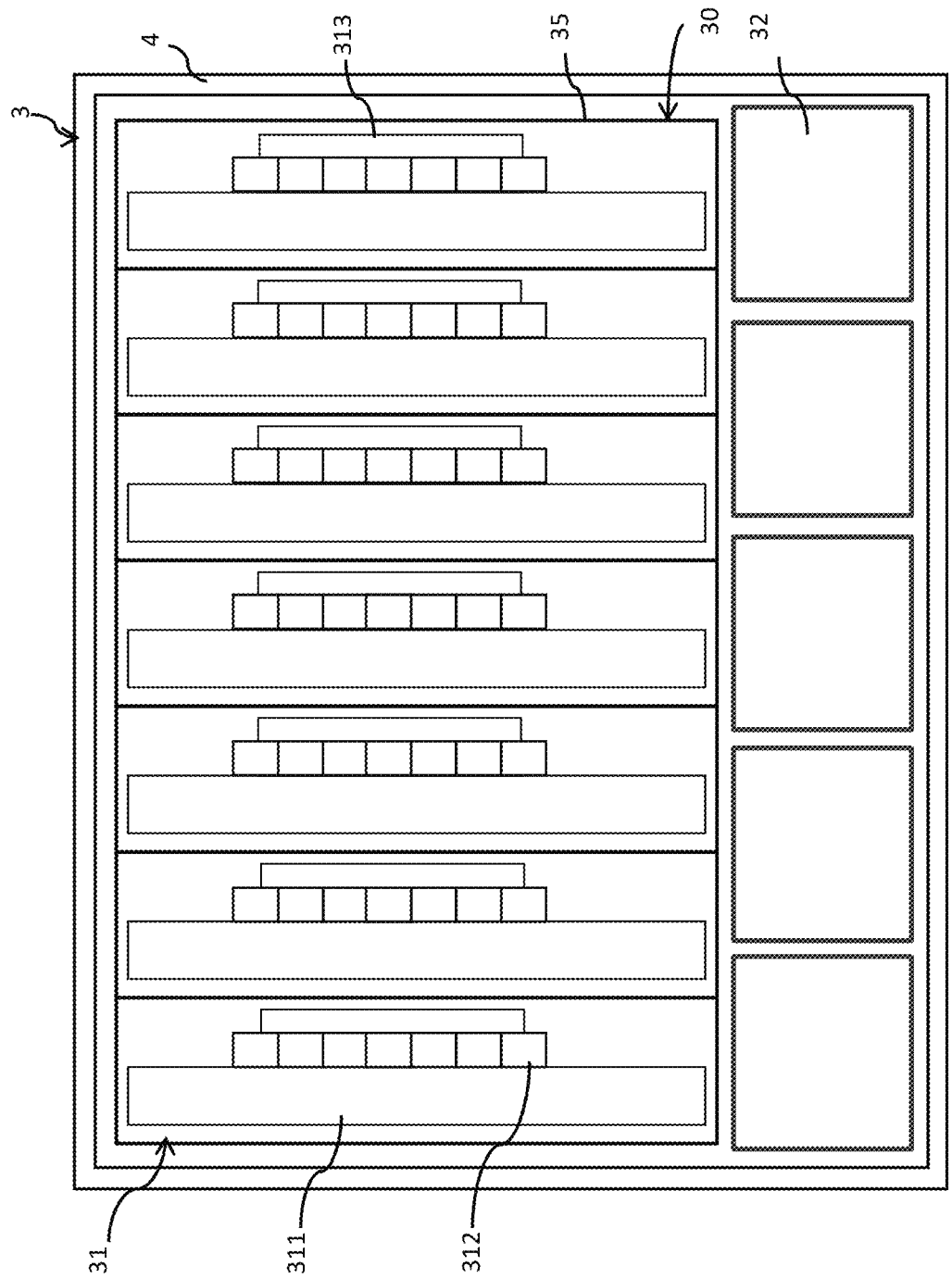
FIG. 3 is a front view of the logic module of FIG. 1.

FIG. 3 is front view of the logic module 3 of FIG. 1.

In the logic module 3, the plurality of logic boards 31 configuring the logic board group #A are arranged in parallel with each other in a width direction, and the plurality of fans 32b are provided side by side below the logic boards 31 so as to direct in a rear direction. In other words, the plurality of fans 32b face the flow path f1, and are provided side by side in parallel with aligning directions of the plurality of logic boards 31 configuring the logic board group #A. Thereby, a cooling wind is generated at the flow path f1. Incidentally, the fan 32b and the logic board 31 may be arranged not to overlap each other in an up and down direction at the front face of the logic module 3.

The plurality of logic boards 31 configuring the logic board group #A are respectively stored to logic boxes 35. A front face and a rear face of the logic box 35 may be opened so as not to hinder a cooling wind blown from the fan 32. The logic board 31 is arranged along the flow path f1 of the cooling wind. The logic board 31 includes a board main body 311, the connector 312 coupled to the back-plane 36, and the part 313. The part 313 may differ in accordance with a kind of the logic board 31. Various kinds of the parts 313 may configure apart group having the plurality of parts. Incidentally, although in the example, the single logic board 31 is arranged to the single logic box 35, the example is not limited thereto. Also, the plurality of logic boards 31 may be arranged to the single logic box 35, or the plurality of logic boards 31 may be arranged without arranging the logic box 35.

Figure 4:
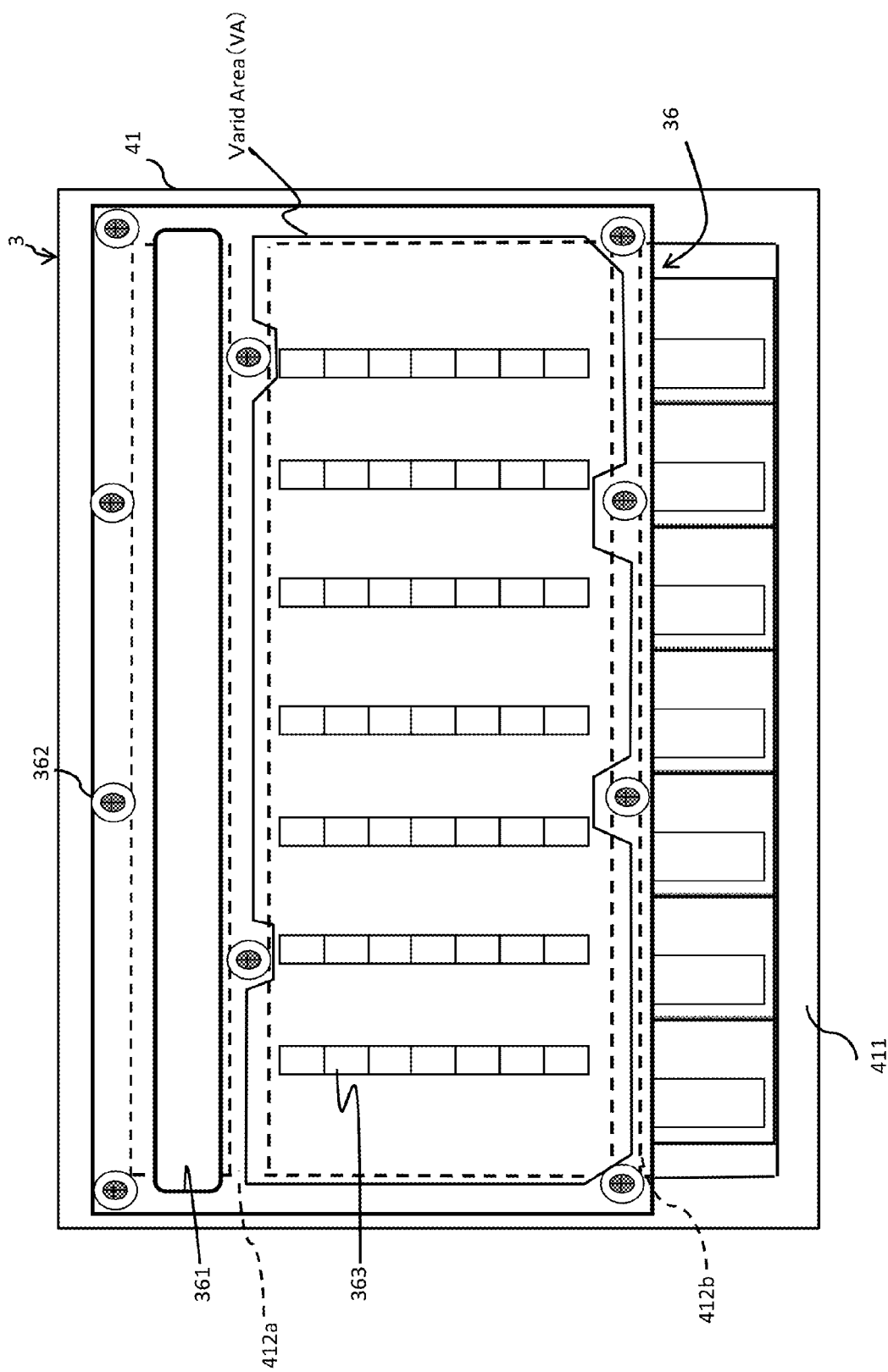
FIG. 4 is a sectional view taken along a line A-A of FIG. 1.

FIG. 4 is a sectional view taken along a line A-A of FIG. 1.

The logic module 3 is surrounded by a frame 41 which is a portion of the enclosure 4 mounting the storage system 1. The frame 41 is configured by a peripheral edge portion 411, and a reinforcing portion 412. According to the example, the reinforcing portion 412 is configured by an auxiliary portion 412a and an auxiliary portion 412b respectively provided in parallel with an upper edge and a lower edge of the peripheral edge portion 411. The back-plane 36 is attached to the frame 41 by a screw 362 as a fastening device. Specifically, an upper edge and a lower edge of the back-plane 36 are fixed to an upper side of the peripheral edge portion 411 and the auxiliary portion 412b by respective four screws substantially at equal intervals.

The back-plane 36 is arranged at a position which differs from a position of the flow path f1. Specifically, for example, a size of the back-plane 36 is configured such that a length thereof in a width direction of the back-plane 36 is substantially the same as that of the frame 41, and a length thereof in an up and down direction of the back-plane 36 is shorter than that in the up and down direction of the frame 41. For example, the length in the up and down direction of the back-plane 36 may be made to be configured by 70% through 75% of the length in the up and down direction of the peripheral edge portion 411.

The air hole 361 is arranged at a position facing the fan 32a to pass the cooling wind through the flow path f2. Incidentally, although according to the example, the single air hole is provided, the plurality of through holes may be configured.

The back-plane 36 is provided with the plurality of connectors 363 for coupling the logic board 31. Specifically, a wiring portion coupling the back-plane 36 and the logic board 31 is coupled via the connector 363 and the connector 312. An area including the wiring portion between the back-plane 36 and the logic board 31 is made to be a valid area VA (Valid Area). A high speed wiring portion and a low speed wiring portion of the valid area may be arranged alternately in an up and down direction. Incidentally, the high speed wiring portion is, for example, PCI-Express.

Figure 5:
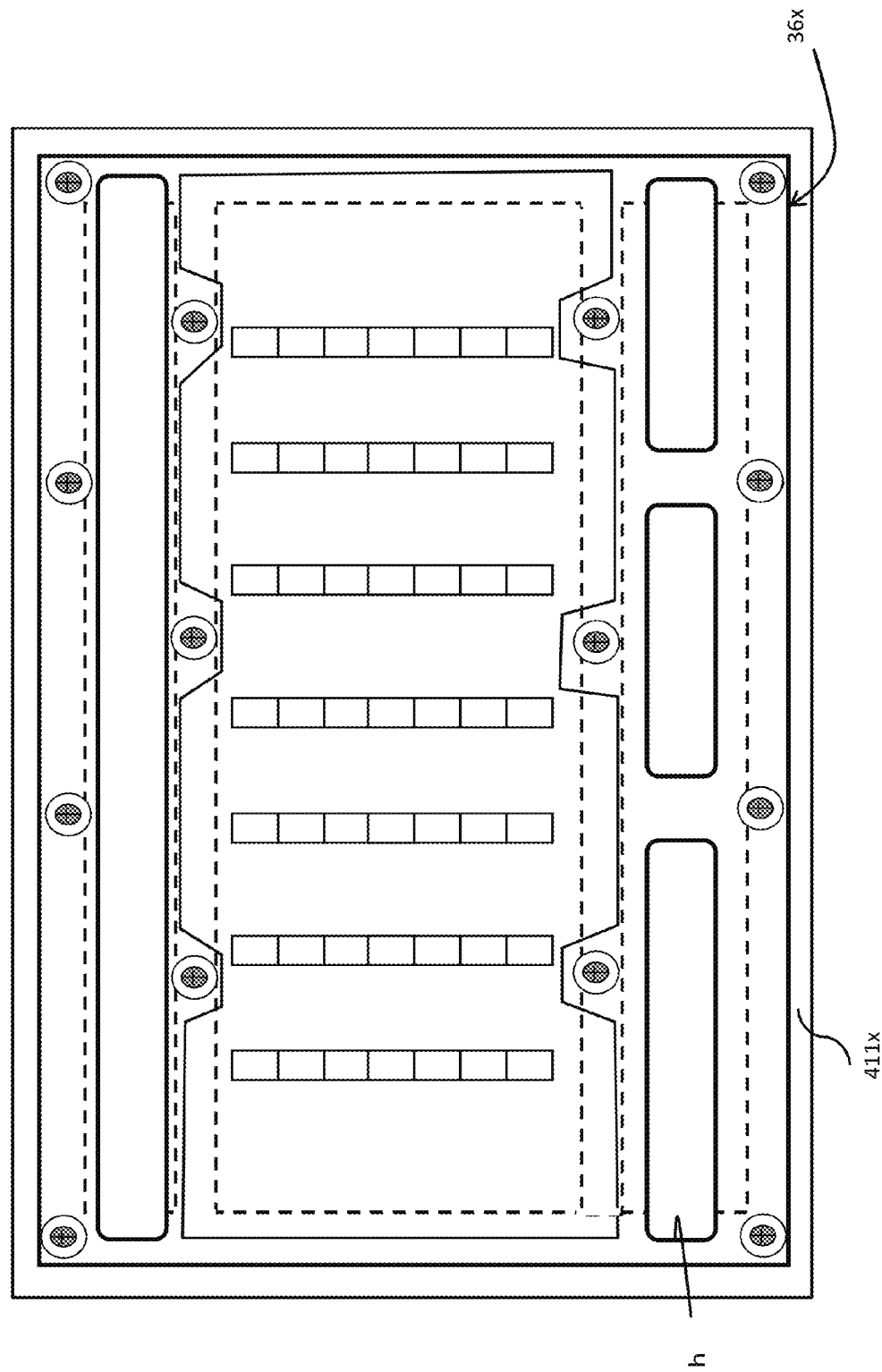
FIG. 5 is a reference view for explaining other back-plane.

As described above, the flow path f1 of the cooling wind can widely be ensured by arranging the back-plane 36 at a position which differs from a position of the flow path f1, and the cooling efficiency of the logic board 31 can be increased. Specifically, for example, the flow path of the cooling wind can widely be configured in comparison with that in a case where an air hole h is provided at a lower portion of a back-plane 36x extended over a total of a peripheral edge portion 411x as shown in FIG. 5. In this case, also a size of the air hole h needs to be taken into consideration as shown in FIG. 5 in order to maintain a strength of the back-plane 36x at a prescribed strength or more. According to this embodiment, the flow path f1 of the cooling window can widely be ensured by arranging the back-plane 36 at a position which differs from that of the flow path f1, and the cooling efficiency of the logic board 31 can be increased. Also, a fan revolution number, that is, a wind amount and a wind speed of the cooling wind can be reduced by widely configuring the flow path f1. Thereby, a number of the fans 32 and maintenance cost of the logic module 3 can be reduced.

Also, an area of the back-plane 36 according to this embodiment can be made to be smaller than that of the back-plane 36x as shown in FIG. 5. Further, according to this embodiment, only a lower portion of the back-plane 36 is reduced, and therefore, the valid area is not reduced, and it is not necessary to reduce a number of the connectors 363.

Further, an interval between the air hole 361 and the valid area of the back-plane 36 is fixed to the auxiliary portion 412a by the two screws 362. According to the embodiment, a number of the screws 362 for fixing the back-plane 36 to the enclosure 4 can be reduced by making an area of the back-plane 36 per se smaller than that of the back-plane 36x as shown in FIG. 5. Thereby, cost for fabricating the logic module 3 can be reduced, and an efficiency of an assembling operation can be improved. Also, the screws 362 can be reduced even at the valid area.

Figure 6:
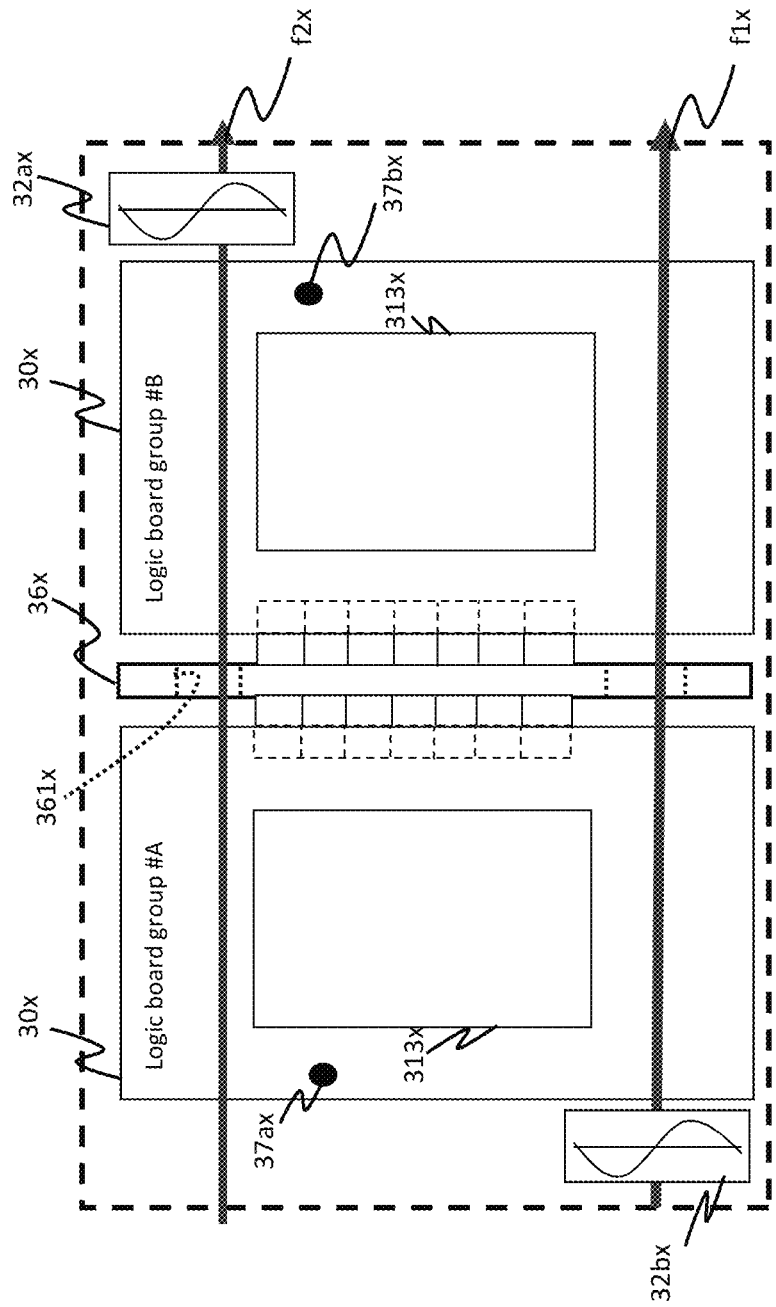
FIG. 6 is a reference view for explaining a configuration of other logic module.

Further, according to the embodiment, respective ones of the logic board groups 30 are arranged at the respective flow paths f1 and f2 by arranging the fans 32a and 32b at the positions which differ in the up and down direction and shifting the two logic board groups 30 in the up and down direction (refer to FIG. 2). For example, a cooling efficiency of the logic board 31 of the cooling mechanism of the logic module 3 of the embodiment is more excellent than that of a logic module 3x in which a plurality of logic board groups 30x are arranged by aligning positions thereof in the up and down direction and both of two flow paths f1x and f2x pass in the two logic board groups 30x as shown in FIG. 6. In addition, respective ones of the flow paths are corresponded to the respective logic board groups 30, and therefore, an arrangement of the logic board group 30 may be taken into consideration by a width of the flow path. For example, according to the embodiment, a cross section orthogonal to a flow direction of the flow path f1 in correspondence with the logic board group #B is formed to be wider than that of the flow path f2 in correspondence with the logic board group #A. Therefore, the logic board 31 having a high heat generating amount of a part may be arranged at the logic board group #B rather than the logic board group #A.

Further, according to the embodiment, the plurality of fans 32b face the flow path f1, and are provided side by side in parallel with an aligning direction of the plurality of logic boards 31 configuring the logic board group #A. Thereby, the cooling wind can be made to flow over a total of the lower space which is the flow path f1, and a total can efficiently be cooled. Also, according to the embodiment, the plurality of fans 30a face the flow path f2, and are provided side by side in parallel with an aligning direction of the plurality of logic boards 31 configuring the logic board group #B. Thereby, a cooling wind can be made to flow over a total of the upper space which is the flow path f2, and the total can efficiently be cooled.

Incidentally, according to the embodiment, the fan 32a for blowing the cooling wind to the flow path f1 and the fan 32b for sucking the cooling wind from the flow path f2 are provided as fans for generating the cooling winds at the flow paths f1 and f2 in the logic module 3. Thereby, the cooling winds passing the flow paths f1 and f2 can smoothly be made to flow in the flowing direction in the logic module 3.

Incidentally, according to the embodiment, the back-plane 36 is arranged at the position which differs from that of the flow path f1 of the cooling wind. Specifically, the back-plane 36 is configured by excluding the lower space facing the fan 32b. However, the embodiment is not limited thereto. For example, the back-plane 36 may be arranged at a position which differs from that of the flow path f2 of the cooling wind. In this case, the back-plane 36 may include an air hole at a position facing the fan 32b, and may be configured by excluding the upper space facing the fan 32a.

Figure 7:
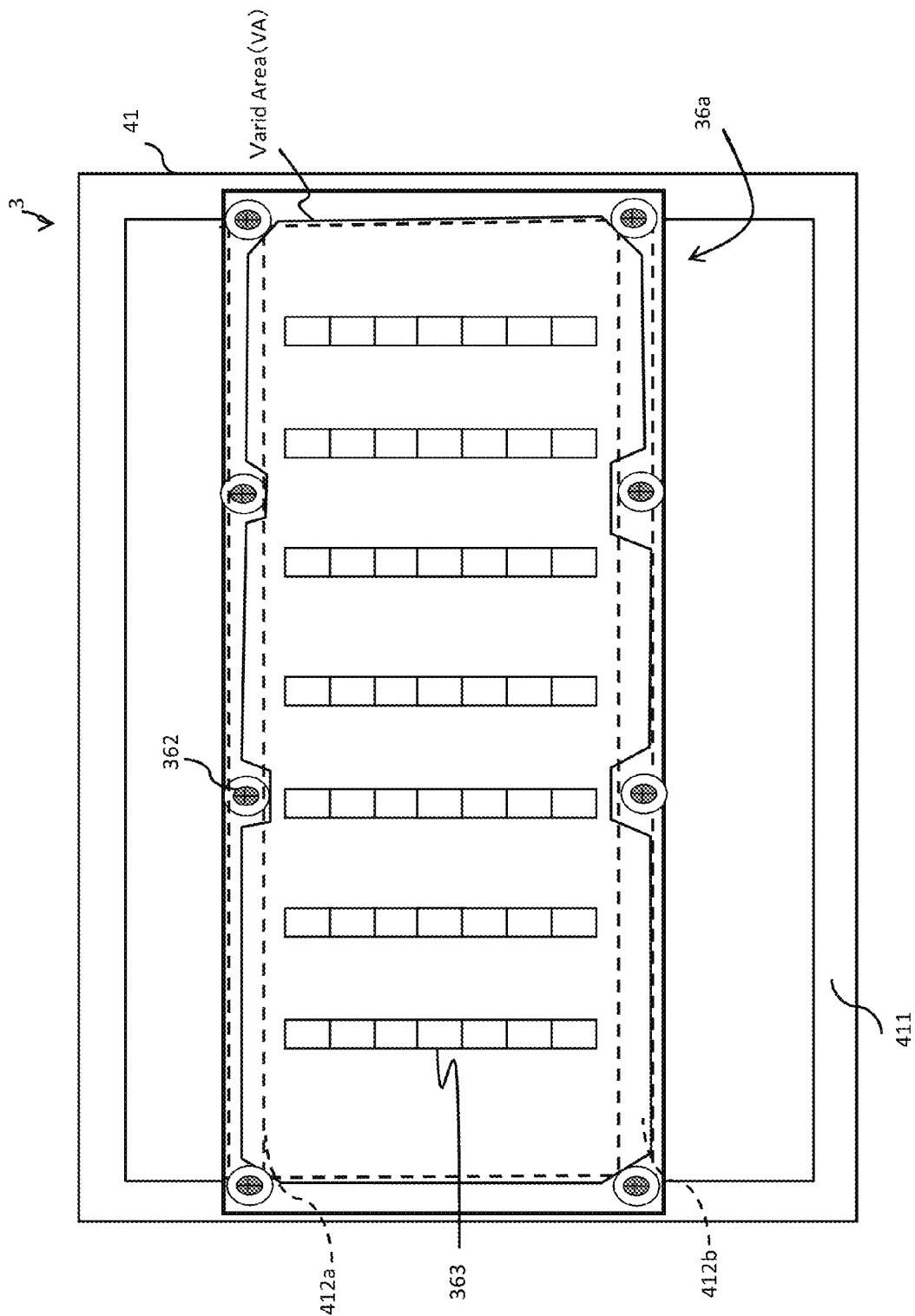
FIG. 7 is a view for explaining a modified example of a back-plane of Example 1.

FIG. 7 is a view for explaining a modified example of the back-plane 36 according to Example 1.

A back-plane 36a is arranged at a position which differs from positions of the flow paths f1 and f2 of the cooling winds. Specifically, the back-plane 36a may be configured by excluding the lower space facing the fan 32b and the upper space facing the fan 32a. Thereby, both of the two flow paths f1 and f2 having different cooling winds can widely be ensured, and the cooling efficiency of the logic board 31 can further be improved. Particularly, in a case where the flow paths f1 and f2 for cooling the two logic board groups 30 differ from each other as in the embodiment, the respective logic board groups 30 can efficiently be cooled. In this case, an upper edge of the back-plane 36a is fixed to the auxiliary portion 412a by the four screws 362. According to the modified example, the number of the screws 362 of fixing the back-plane 36 to the enclosure 4 can be reduced by reducing an area of the back-plane 36 per se in comparison with that of the back-plane 36x shown in FIG. 4.

Next, an explanation will be given of a temperature management method of a cooling structure of the logic module 3 according to Example 1.

According to the embodiment, the plurality of fans are controlled based on a temperature of the logic board group 30. An explanation will be given of respective controls of one or more fans 32a corresponded to the logic board group #A and one or more fans 32b corresponded to the logic board group #B as follows.

Figure 8:
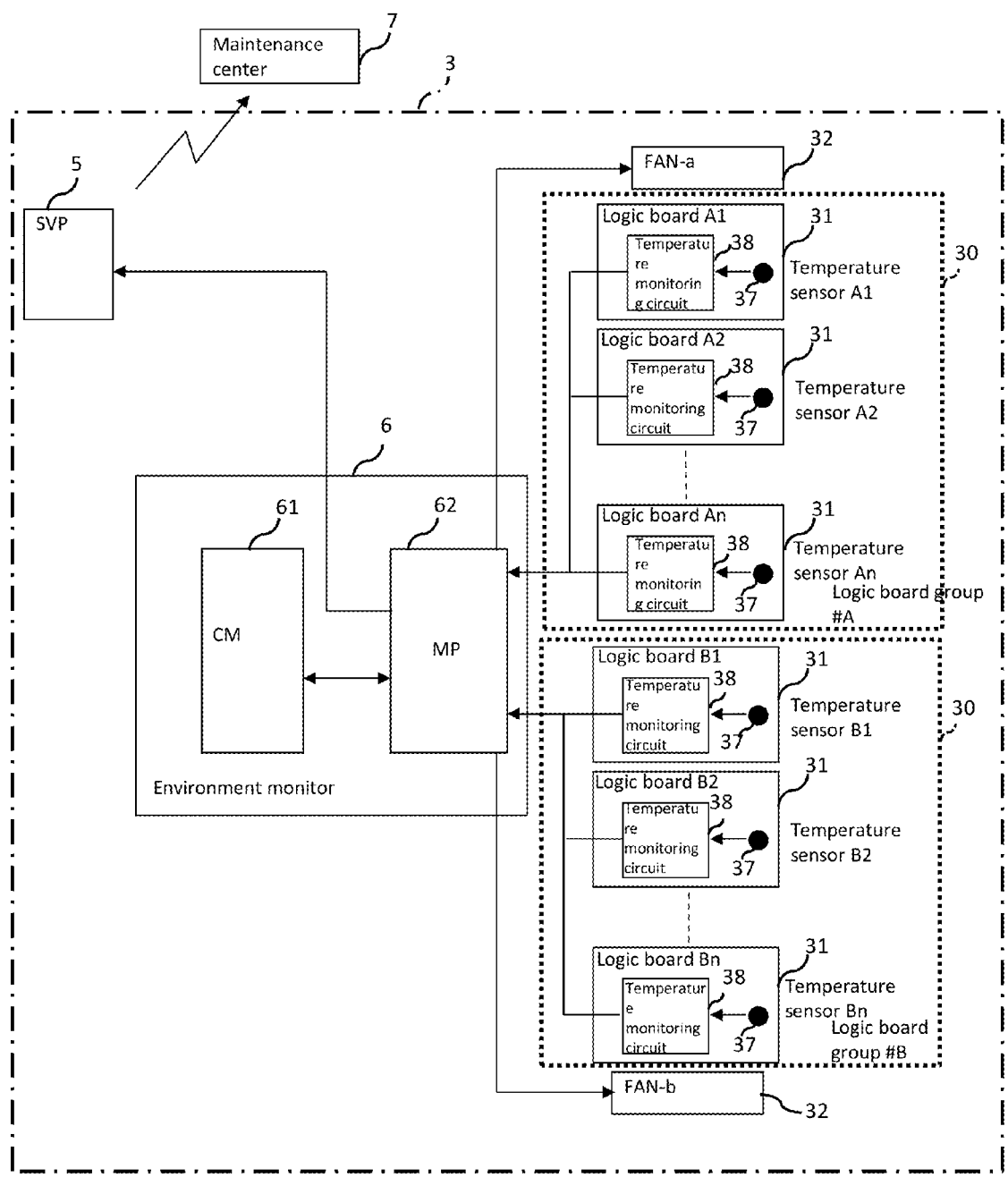
FIG. 8 is a configuration diagram of a logic module of Example 1.

FIG. 8 is a configuration diagram of the logic module 3 of Example 1.

The logic module 3 is mounted with the plurality of logic board groups 30, one or more fans 32, an environment monitor 6, and a service processor (SVP) 5. The environment monitor 6 and the SVP 5 may be provided at the logic board 31 in the logic board groups 30, or may be provided at outside of the logic module 3. According to the embodiment, the plurality of logic boards 31 configuring the logic board group 30 are respectively mounted with temperature sensors 37. Specifically, for example, as described in explaining FIG. 2, the logic boards A1 through An configuring the logic board group #A are respectively installed with the temperature sensors A1 through An at front portions of the logic boards A1 through An and on front sides of the parts 313. Also, the logic boards B1 through Bn configuring the logic board group #B are respectively installed with the temperature sensors B1 through Bn at rear portions of the logic boards B1 through Bn and on rear sides of the parts 313. Consequently, a temperature of air flowing into the logic module 3 is measured by the temperature sensors A1 through An, and a temperature of air flowing out from the logic module 3 is measured by the temperature sensors B1 through Bn. Further, for example, the respective logic boards 31 include temperature monitoring circuits 38 as portions of the parts 313. The temperature monitoring circuit 38 is coupled to the environment monitor 6, and transmits a measured value detected by the temperature sensor 37 to the environment monitor 6.

The environment monitor 6 includes a cache memory (CM) 61 and a microprocessor (MP) 62. The environment monitor 6 is coupled to the SVP 5. The SVP 5 receives configuration information of the logic board group 30 from the environment monitor 6 and transmits the configuration information to a maintenance center 7.

The microprocessor 62 of the environment monitor 6 receives the configuration information of the logic board group 30 and temperatures of the respective logic boards 31 to store to the cache memory 61 as a temperature management table 90.

FIG. 9 shows the temperature management table 90 of Example 1.

The temperature management table 90 is a table for managing the plurality of logic boards 31 mounted to the logic module 3. Specifically, for example, the temperature management table 90 is stored with temperature information or the like of the temperature sensors 37 installed at the respective logic boards 31. The temperature management table 90 includes entries for the respective logic boards 31. Each entry includes a fan number 901 indicating an identifier of the corresponding fan 32, a rotation number 902 of the fan, a logic board number 903 indicating an identifier of the logic board, a sensor number 904 indicating an identifier of the temperature sensor installed at the logic board, temperature information 905 indicating a temperature of the temperature sensor, mounting information 906 indicating whether the logic board is mounted, and a lock-out information 907 indicating life or death of the logic board. The fan 32 in correspondence with the logic board 31 is the fan 32 positioned on a front side or on a rear side of the logic board. The mounting information 906 is made to be "1" in a case of mounting the logic board and "0" in a case of not mounting the logic board. Further, the lock-out information 907 is made to be "1" in a case of operating the logic board and "0" in a case of not operating the logic board. For example, the logic board A1 is mounted to the logic module and can be operated. Further, the logic board A1 is mounted with the temperature sensor A1 and a measured value of the temperature sensor A1 is 25° C. Further, a fan in correspondence with the logic boards A1 through An is a fan a, and the rotation number is AA/rpm. Further, for example, the logic board B1 is mounted to the logic module and is operated. Further, the logic board B1 is installed with the temperature sensor B1 and a measured value of the temperature sensor B1 is 120° C. Further, a fan in correspondence with the logic boards B1 through Bn is a fan b and the rotation number is BB/rpm. Incidentally, in the following explanation, there is a case where the fan in correspondence with the logic board group #A is explained as the fan a and the fan in correspondence with the logic board group #B is explained as the fan b.

Figure 10:
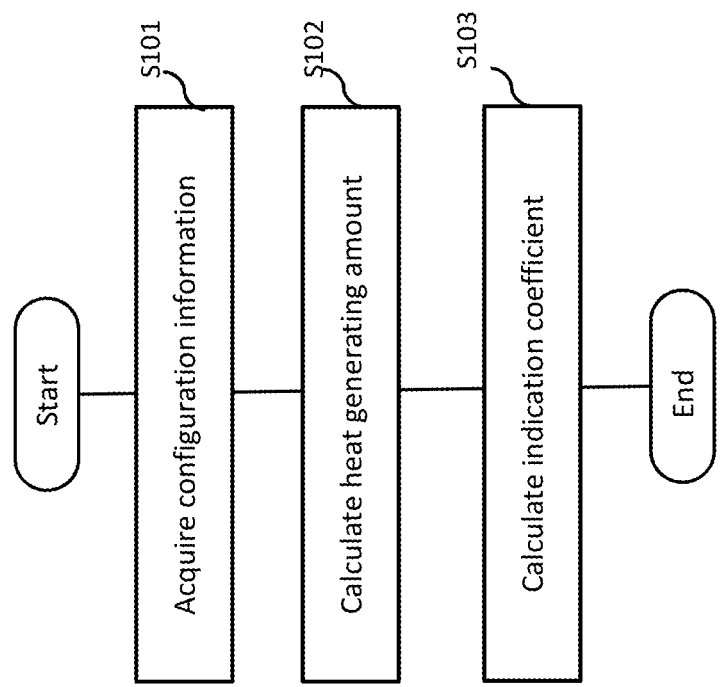
FIG. 10 is a flowchart of a calculation processing operation of an indication coefficient.

FIG. 10 is a flowchart of processing operations of calculating an indication coefficient.

The processing operations are executed by the MP 62 of the environment monitor 6.

At S101, the MP 62 receives the configuration information of the logic board group 30 in the logic module 3 from the SVP 5. Specifically, for example, the configuration information of the logic board group 30 is the identifiers of the respective logic boards 31 configuring the logic board groups #A and #B, the identifier of the corresponding fan, the identifier of the sensor installed at the logic board, information whether the logic board is mounted, and the lock-out information indicating life or death of the logic board. The MP 62 configures or updates the temperature management table 90 based on the configuration information.

At S102, the MP 62 calculates a heat generating amount of the logic board group 30. For example, the MP 62 calculates a total heat generating amount of each logic board group 30 based on a heat generating amount of a certain one of the logic board 31 which is previously defined. Incidentally, the heat generating amount of the one logic board 31 may be defined for each kind of the logic board.

At S103, the MP 62 calculates the indication coefficient for calculating the rotation number of the fan 32 in correspondence with the logic board group 30 based on the total heat generating amount of the logic board group 30 calculated at S102. Specifically, for example, the indication coefficient is a value indicating by what magnification factor the rotation number is multiplied when a measured value of a certain temperature is measured based on the fan rotation number at a temperature which becomes a criteria that is previously configured. Incidentally, the MP 62 may store the calculated indication coefficient to the cache memory 61.

The MP 62 determines a new rotation number of the fan based on the temperature, the indication coefficient, and a current rotation number of the fan.

Figure 11:
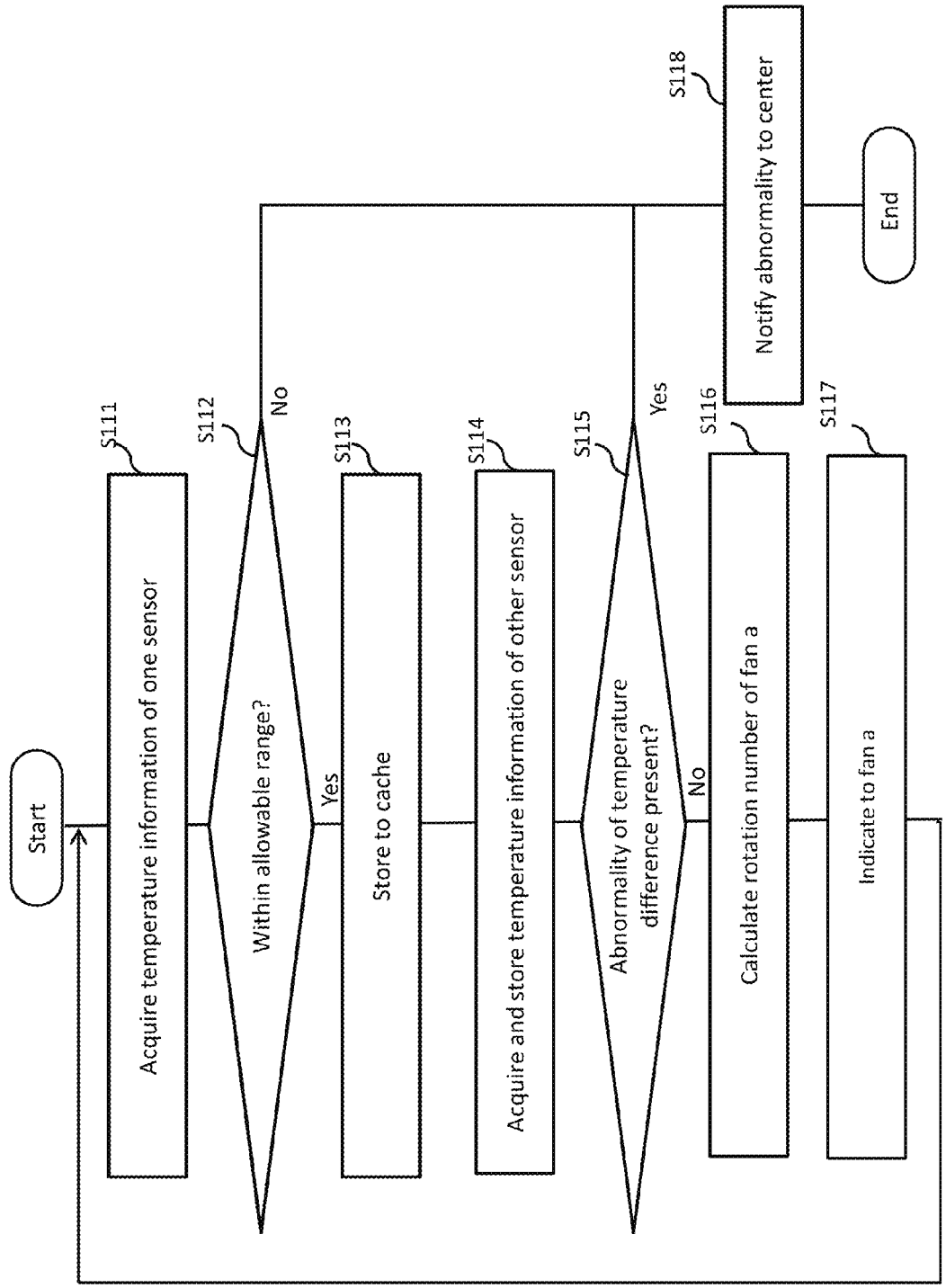

FIG. 11 is a flowchart of rotation control processing operations of the fan a.

The processing operations are executed by the MP 62 of the environment monitor 6.

At S111, the MP 62 acquires temperature information of the temperature sensor 37a installed at one of the logic boards 31 belonging to the logic board group #A. Here, an explanation will be given of an operation in a case where the MP 62 acquires a measured value of the temperature sensor A1.

At S112, the MP 62 determines whether the measured value of the temperature sensor A1 is within an allowable range which is previously registered to the corresponding logic board 31. In a case where a result of the determination is true (Yes at S112), the MP 62 proceeds the processing operations to S113. On the other hand, in a case where the result of the determination is false (No at S112), the MP 62 proceeds the processing operations to S118.

At S113, the MP 62 stores the measured value of the temperature sensor A1 to the temperature management table 90 on the cache memory 61.

At S114, the MP 62 acquires temperature information of the temperature sensor 37 installed to other logic board 31 belonging to the logic board group #A to store to the cache memory 61. Specifically, for example, the MP 62 acquires measured values of the temperature sensors A2 through An respectively in correspondence with the logic boards A2 through An to store to the temperature management table 90 on the cache memory 61.

At S115, the MP 62 determines whether there is an abnormal value in the temperature information of the temperature sensor 37a installed at the other logic board 31 belonging to the logic board group #A. Specifically, for example, the MP 62 determines whether a value exceeding the allowable range which is previously registered is present for the corresponding logic board 31 in acquired measured values of the respective temperature sensors A2 through An. In a case where a result of the determination is true (Yes at S115), the MP 62 proceeds the processing operations to S118. On the other hand, in a case where the result of determination is false (No at S115), the MP 62 proceeds the processing operations to S116.

At S116, the MP 62 calculates the rotation number of the fan a based on the temperature management table 90, a heat generating amount which is previously configured to the logic board in correspondence with the temperature sensor A1, and the indication coefficient stored to the cache memory 61. Incidentally, the indication coefficient is a value calculated by the processing operation of calculating the indication coefficient (refer to FIG. 10).

At S117, the MP 62 indicates the rotation number calculated at S116 to the fan a, and proceeds the processing operations to S111 after an elapse of prescribed time. The fan a changes the rotation number based on the indication.

At S118, the MP 62 notifies an abnormality to the maintenance center 7 and finishes the processing operations.

A control of the fans a respectively in correspondence with the plurality of logic boards 31 in the logic board group #A can pertinently be carried out by the processing operations described above. Also, in a case where an abnormality is present at the temperature of the logic board group #A, the case can be notified to the maintenance center.

Figure 12:
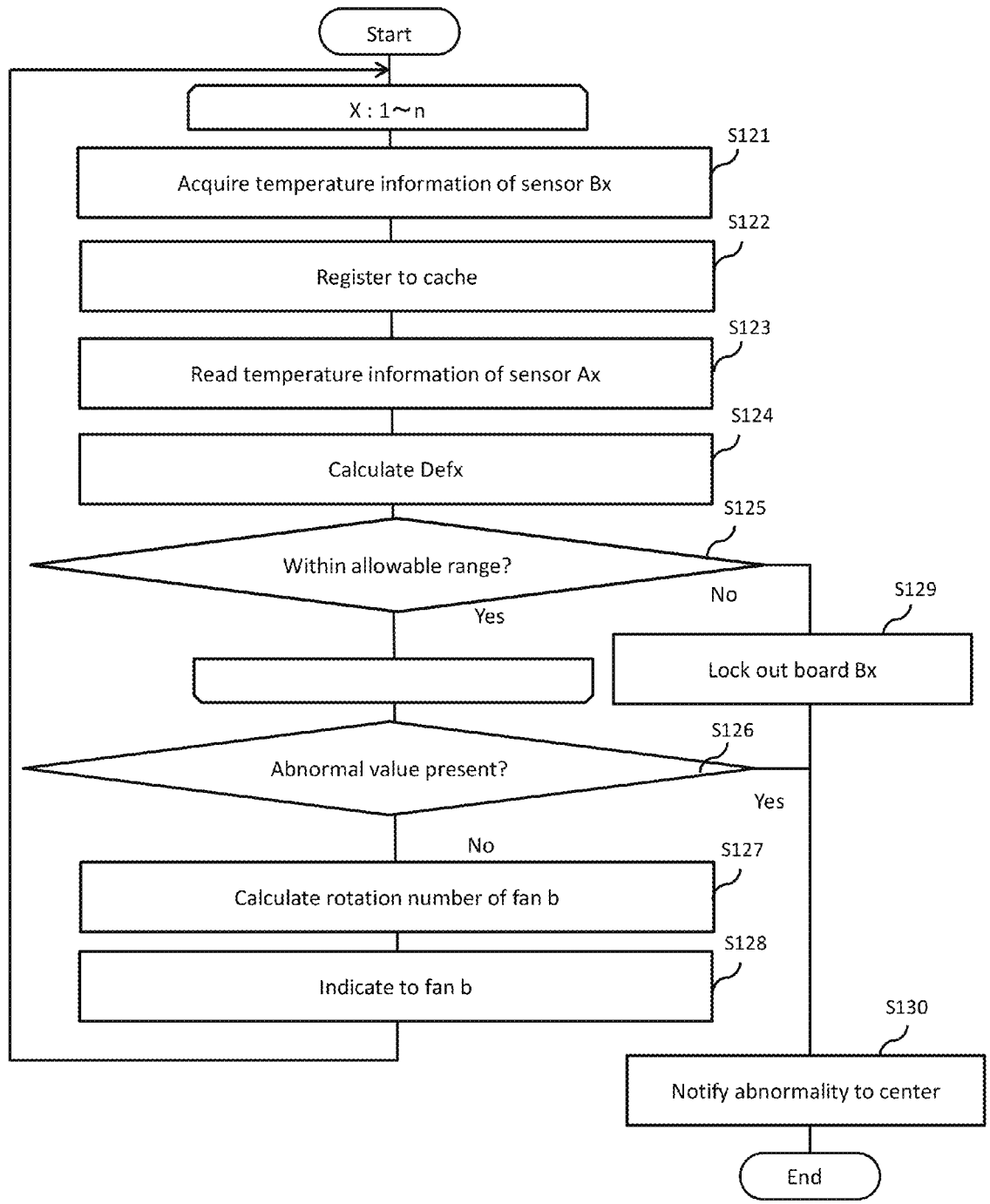
FIG. 12 is a flowchart of a rotation control processing operation of a fan b.

FIG. 12 is a flowchart of rotation control processing operations of the fan b.

The processing operations are executed by the MP 62 of the environment monitor 6.

The MP 62 executes the following processing operations S121 through S125 respectively for the respective logic boards Bx (x=1 through n) configuring the logic board group #B.

At S121, the MP 62 acquires temperature information of the temperature sensor Bx installed at the logic board Bx. Specifically, for example, the MP 62 acquires a measured value of the temperature sensor Bx.

At S122, the MP 62 stores a measured value of the temperature sensor B1 to the temperature management table 90 on the cache memory 61.

At S123, the MP 62 acquires temperature information of the temperature sensor Ax from the temperature management table 90 on the cache memory 61.

At S124, the MP 62 calculates a difference between temperature information of the temperature sensor Bx and temperature information of the temperature sensor Ax (Defx=Bx−Ax, in the following, there is a case of referring the difference as a difference temperature).

At S125, the MP 62 determines whether the difference temperature Defx calculated at S124 falls within an allowable range. Specifically, for example, the MP 62 determines whether the difference temperature falls within the allowable range by referring to the allowable range of the one difference temperature Defx which is previously registered. In a case where a result of the determination is false (No at S125), the MP 62 proceeds the processing operations to S129. On the other hand, in a case where the result of the determination is true (Yes at S125), the MP 62 executes a next processing operation (S121 or S126).

At S126, the MP 62 compares difference temperatures of all the pairs of the temperature sensors (temperature sensors Bx and temperature sensors Ax), and determines whether an abnormality value is present in the difference temperatures. In a case where a result of the determination is false (No at S126), the MP 62 proceeds the processing operations to S127. On the other hand, in a case where the result of the determination is true (Yes at S125), the MP 62 proceeds the processing operations to S130.

At S127, the MP 62 calculates the rotation number of the fan b. Specifically, for example, the MP 62 calculates the rotation number of the fan b based on the difference temperature of one pair of the temperature sensors and an indication coefficient.

At S128, the MP 62 indicates the rotation number calculated at S127 to the fan b, and proceeds the processing operations to S121 after an elapse of prescribed time. The fan b changes the rotation number based on the indication.

At S129, the MP 62 locks out the logic board Bx in correspondence with the difference temperature Defx exceeding the allowable range at S125. At this occasion, for example, the MP 62 stores a statement that the logic board Bx is locked out in the temperature management table 90 on the cache memory 61.

At S130, the MP 62 notifies the abnormality to the maintenance center 7 and finishes the processing operations.

The control of the fan b in correspondence with the logic board group #B can pertinently be carried out by the processing operations described above. Also, in a case where the abnormality is present in the temperature of the logic board group #B, the statement can be notified to the maintenance center 7.

According to this embodiment, the logic board groups #A and #B are arranged to be shifted in the up and down direction to overlap the flow paths f1 and f2 respectively different from each other. Further, the MP 62 respectively measures a temperature of air flowing into the logic module 3 (that is, ambient air temperature) and a temperature of air flowing out from the logic module 3 by the temperature sensors A1 through An and B1 through Bn. Consequently, the one flow path f1 (f2) cools the one logic board group #B (#A). Consequently, a heat generating temperature (heat generating amount) of the logic board group #B can be estimated by calculating the difference temperature Defx of temperature information of the temperature sensor Bx and temperature information of the temperature sensor Ax.

Figure 13:
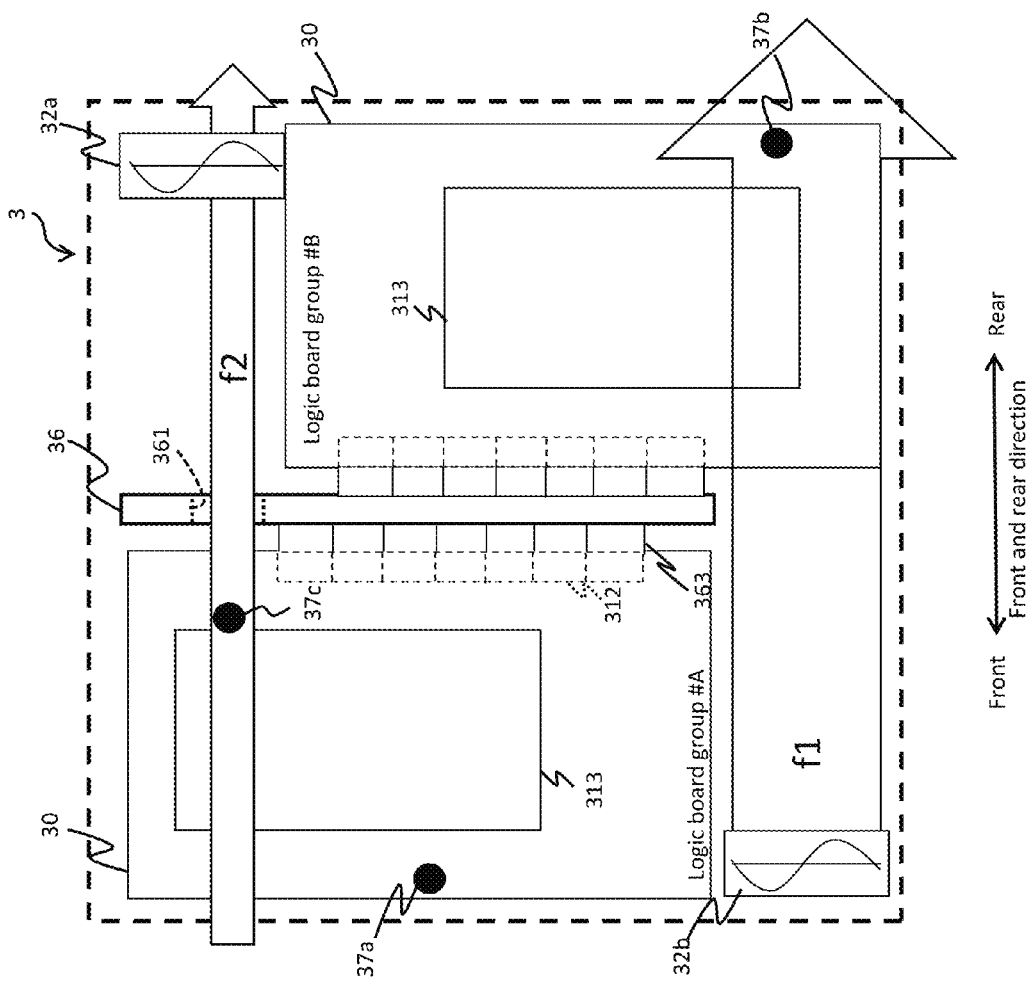
FIG. 13 is a view for explaining a position of installing a temperature sensor.

Consequently, concerning the fan b in correspondence with the logic board group #B, temperatures are calculated based on actual measurement values of the temperature sensors 37a and 37b, and the rotation number of the fan b is calculated based on the calculated temperatures. On the other hand, concerning the fan a in correspondence with the logic board group #A, temperatures are estimated based on a previously configured heat generating amount and the actual measurement value of the temperature sensor 37a, and the rotation number of the fan a is calculated based on the estimated temperature. However, not a predicted value of a temperature of the part 313 based on the ambient air temperature but the actual measurement values measured by the temperature sensors 37a and 37b may be used even for controlling the fan a in correspondence with the plurality of logic boards 31 configuring the logic board group #A. In this case, for example, the temperature sensors 37a are installed at front portions of the logic board groups A1 through An configuring the logic board group #A, and temperature sensors 37c are installed at rear portions of the logic boards A1 through An as shown in FIG. 13. Thereby, the MP 62 can calculate a difference temperature of a temperature of the temperature sensor 37c and the temperature of the temperature sensor 37a. Particularly, in this case, the temperature sensors 37b and 37c are respectively installed above the flow paths f1 and f2. Consequently, although the temperature sensor 37b in the flow path f1 is influenced by a temperature of the logic board group #B overlapping the flow path f1, the temperature sensor 37b is difficult to be influenced by a temperature of the logic board group #A which does not overlap the flow path f1. Also, although the temperature sensor 37c in the flow path f2 is influenced by the temperature of the logic board group #A overlapping the flow path f2, the temperature sensor 37c is difficult to be influenced by the temperature of the logic board group #B which does not overlap the flow path f2. Incidentally, in this case, the MP 62 may calculate the rotation number of the fan a based on the difference temperature of the corresponding temperature sensors 37c and 37a instead of S116 of FIG. 11.

Example 2

Example 2 will be explained as follows. At this occasion, an explanation will be given mainly of a point of a difference from Example 1, and the explanation will be omitted or simplified concerning a point common to Example 1.

According to the embodiment, a control of the fan 32 in correspondence with one or more logic boards 31 configuring the logic board group 30 is carried out. In the following, the explanation will be given of the control of one or more fans 32b corresponding to one or more logic boards 30 configuring the logic board group #A as well as one or more fans 32a corresponding to one or more logic board groups 30 configuring the logic board group #B.

Figure 14:
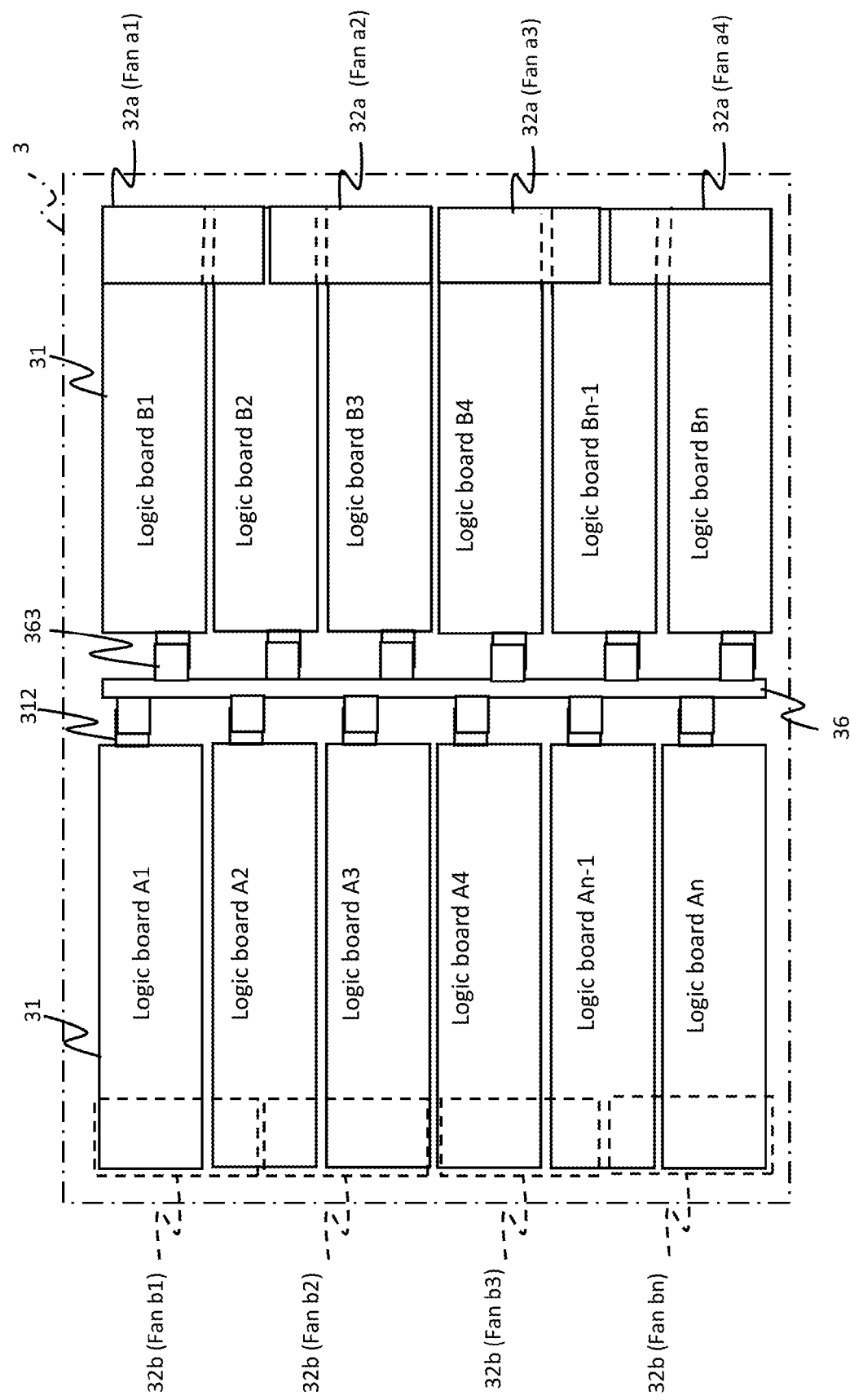
FIG. 14 is a top view of a logic module of Example 2.

FIG. 14 is a top view of the logic module 3 of Example 2.

In the drawing, constituent elements are schematically shown for explaining an arrangement of the logic board 31 and the fan 32 in the logic module 3. In the drawing, an outer shape of the logic module 3 is indicated by a one-dotted chain line. The logic boards A1 through An configuring the logic board group #A are coupled to a front face of the back-plane 36 via the connectors 312. The logic boards B1 through Bn configuring the logic board #B are coupled to a rear face of the back-plane 36 via the connectors 363. A plurality of fans a1 through an are arranged on a lower side of the logic board group #A and on a front side of the logic board group #B. A plurality of fans b1 through bn are arranged on an upper side of the logic board group #B and on a rear side of the logic board group #A.

One or more logic boards 31 in the logic board group #A are arranged on a front side of the one fan 32a, and one or more logic boards 31 in the logic board group #B are arranged on a rear side of the one fan 32b. Specifically, the logic boards A1 and A2 are arranged on a front side of the fan a1, and the logic board groups A2 and A3 are arranged on a front side of the fan a2. Also, the logic boards B1 and B2 are arranged on a rear side of the fan b1, and the logic boards B2 and B3 are arranged on a rear side of the fan b2.

Figure 15:
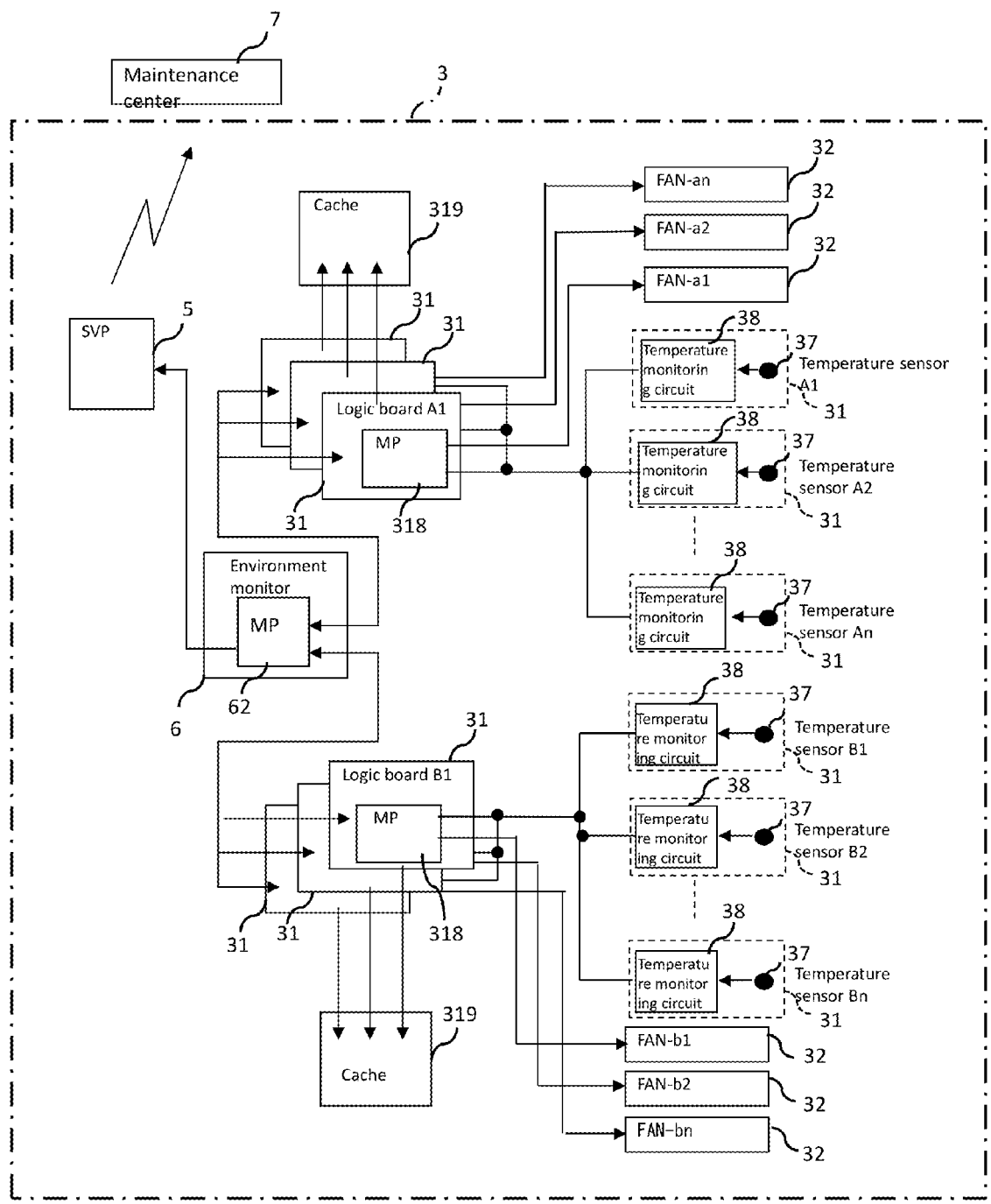
FIG. 15 is a configuration diagram of the logic module of Example 2.

FIG. 15 is a configuration view of the logic module 3 of Example 2.

According to the embodiment, portions of the logic boards 31 having the MPs 318 in the plurality of logic boards 31 in the respective logic board groups 30 control the fans 32. Although according to the embodiment, the MP 318 of the one logic board 31 controls the one fan 32, the embodiment is not limited thereto but the MP 318 of the one logic board 31 may control two or more fans 32.

Further, in the respective logic board groups 30, the respective logic boards 31 include temperature monitoring circuits 38. The respective temperature monitoring circuits 38 are coupled to the plurality of MPs 318. The respective MPs 318 are coupled to the MP 62 of the environment monitor 6, and transmit measured values detected by the temperature sensors 37 to the environment monitor 6. Incidentally, in the drawing, the cache memory 61 in the environment monitor 6 is omitted.

The logic module 3 includes a cache memory 319 as a kind of the logic board 31. One or more cache memories 319 may be corresponded to the plurality of logic boards 31 of the logic board group 30.

FIG. 16 shows a temperature management table 160 of Example 2.

The temperature management table 160 is a table for managing the respective logic boards 31. Specifically, for example, the temperature management table 160 stores temperature information or the like of the temperature sensors 37 installed to the respective logic boards 31. The temperature management table 160 includes entries for the respective logic boards 31. The entry of the one logic board 31 includes a fan number 1601 indicating an identifier of the fan 32 in correspondence with the logic board, a rotation number 1602 of the fan, a logic board number 1603 which is an identifier of the logic board, a sensor number 1604 which is an identifier of the temperature sensor 37 installed at the logic board, temperature information 1605 indicating a temperature of the temperature sensor, mounting information 1606 indicating whether the logic board is mounted, and lock-out information 1607 indicating life or death of the logic board. Incidentally, as described above, one or more logic boards 31 are corresponded to the one fan 32. For example, a fan a1 is corresponded to the logic boards A1 and A2 positioned on a front side thereof, and a fan a2 is corresponded to the logic boards A2 and A3 positioned on a front side thereof. Also, a fan b1 is a corresponded to the logic boards B1 and B2 positioned on a rear side thereof, and a fan b2 is corresponded to the logic boards B2 and B3 positioned on a rear side thereof.

Figure 17:
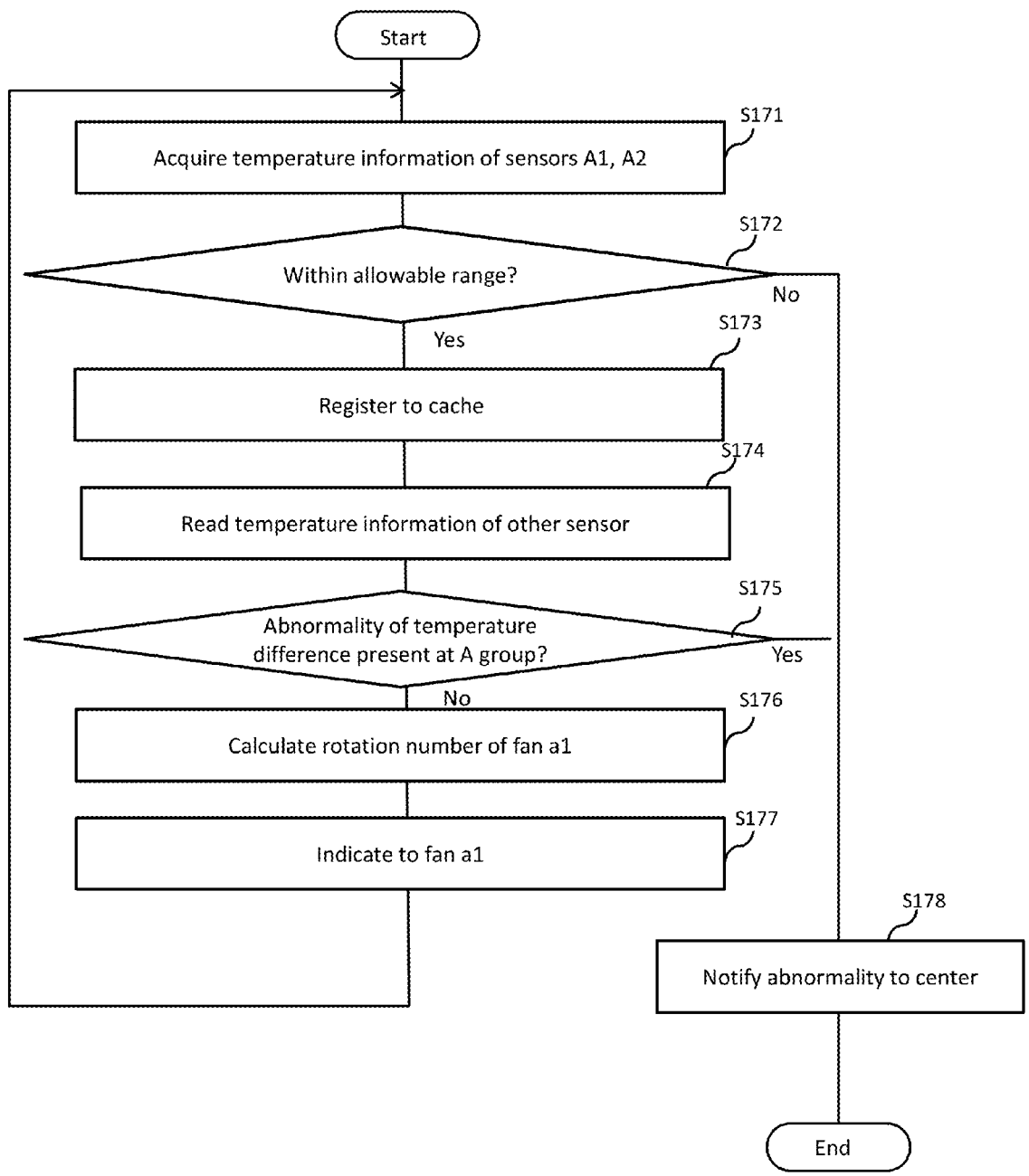
FIG. 17 is a flowchart of a rotation control processing operation of a fan of Example 2.

FIG. 17 is a flowchart of rotation control processing operations of a fan of Example 2.

The processing operations are executed by the respective MPs 318. According to the embodiment, the one fan 32 cools the plurality of logic boards 31. In the following, an explanation will be given of processing operations executed by the MP 318 of the logic board A1 as a representative. Similar processing operations are executed concerning the other logic board 31.

At S171, the MP 318 acquires measured values of the temperature sensors A1 and A2 respectively installed at the logic boards A1 and A2 corresponded to the fan a1.

At S172, the MP 318 determines whether the measured values of the temperature sensors A1 and A2 acquired at S171 fall with an allowable range. Specifically, for example, the MP 318 refers to the allowable range of the temperature which is previously registered, and determines whether the acquired measured values fall within the allowable range. In a case where a result of the determination is false (No at S172), the MP 318 proceeds the processing operations to S178. On the other hand, in a case where the result of the determination is true (Yes at S172), the MP 318 proceeds the processing operations to S173.

At S173, the MP 318 stores the measured values of the temperature sensors A1 and A2 to the temperature management table 160 on the cache memory 319.

At S174, the MP 318 acquires temperature information of temperature sensors other than the temperature sensors A1 and A2 (for example, temperature sensors A3 through An) in correspondence with the logic boards 31 of the logic board group #A from the temperature management table 160 on the cache memory 319.

At S175, the MP 318 determines whether an abnormality value is present in temperature information of the temperature sensor 37 acquired at S174. Specifically, for example, the MP 318 determines whether there is a value exceeding an allowable range in acquired measured values of the respective temperature sensors A3 through An based on an allowable temperature of the logic board 31 which is previously registered. In a case where a result of the determination is true (Yes at S175), the MP 318 proceeds the processing operations to S178. On the other hand, in a case where the result of the determination is false (No at S175), the MP 318 proceeds the processing operations to S176.

At S176, the MP 318 calculates a rotation number of the fan a1. Specifically, for example, the MP 318 calculates the rotation number of the fan a1 based on a temperature of a higher one of the measured values of the temperature sensors A1 and A2, an indication coefficient stored to the cache memory 61 of the environment monitor 6, and a current rotation number of the fan a1. Incidentally, the indication coefficient is a value calculated by the processing operations of calculating the indication coefficient (refer to FIG. 10).

At S177, the MP 318 indicates the rotation number calculated at S176 to the fan a1 and proceeds the processing operations to S171 after an elapse of prescribed time. The fan a1 changes the rotation number based on the indication.

At S178, the MP 318 notifies the abnormality to the maintenance center 7.

The respective MPs 318 can pertinently carry out the controls of the corresponding fans 32 by the above-described processing operations. Also, in a case where an abnormality is present at the temperature of the logic board 31, the statement is notified to the maintenance center 7. Thereby, a load of the control of the fan 32 can be balanced to the plurality of MPs 318.

Incidentally, in a case of controlling the fan bx in correspondence with the logic board configuring the logic board group #B, at S176, the MP 318 may calculate a rotation number of the fan bx based on a temperature of a higher one of measured values of temperature sensors Bx and B (x+1), an indication coefficient stored to the cache memory 61 of the environment monitor 6, and a current rotation number of the fan bx.

Example 3

In the following, Example 3 will be explained. At that occasion, an explanation will be given mainly on a point of a difference from Examples 1 and 2, and the explanation will be omitted or simplified concerning a point common to Example 1.

Figure 18:
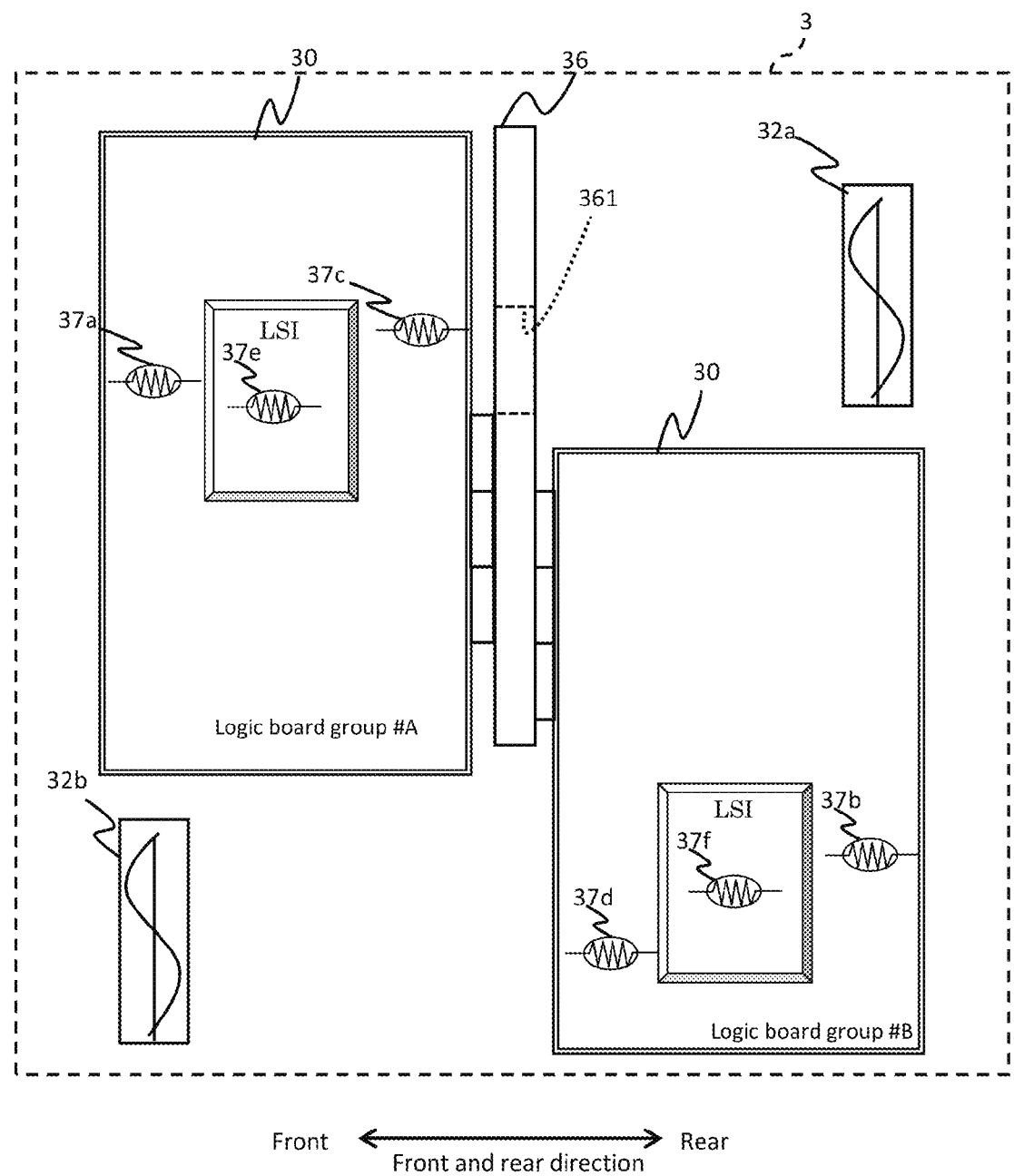
FIG. 18 is a right side view for explaining a logic module according to Example 3.

FIG. 18 is a right side view for explaining the logic module 3 of Example 3.

Figure 19:
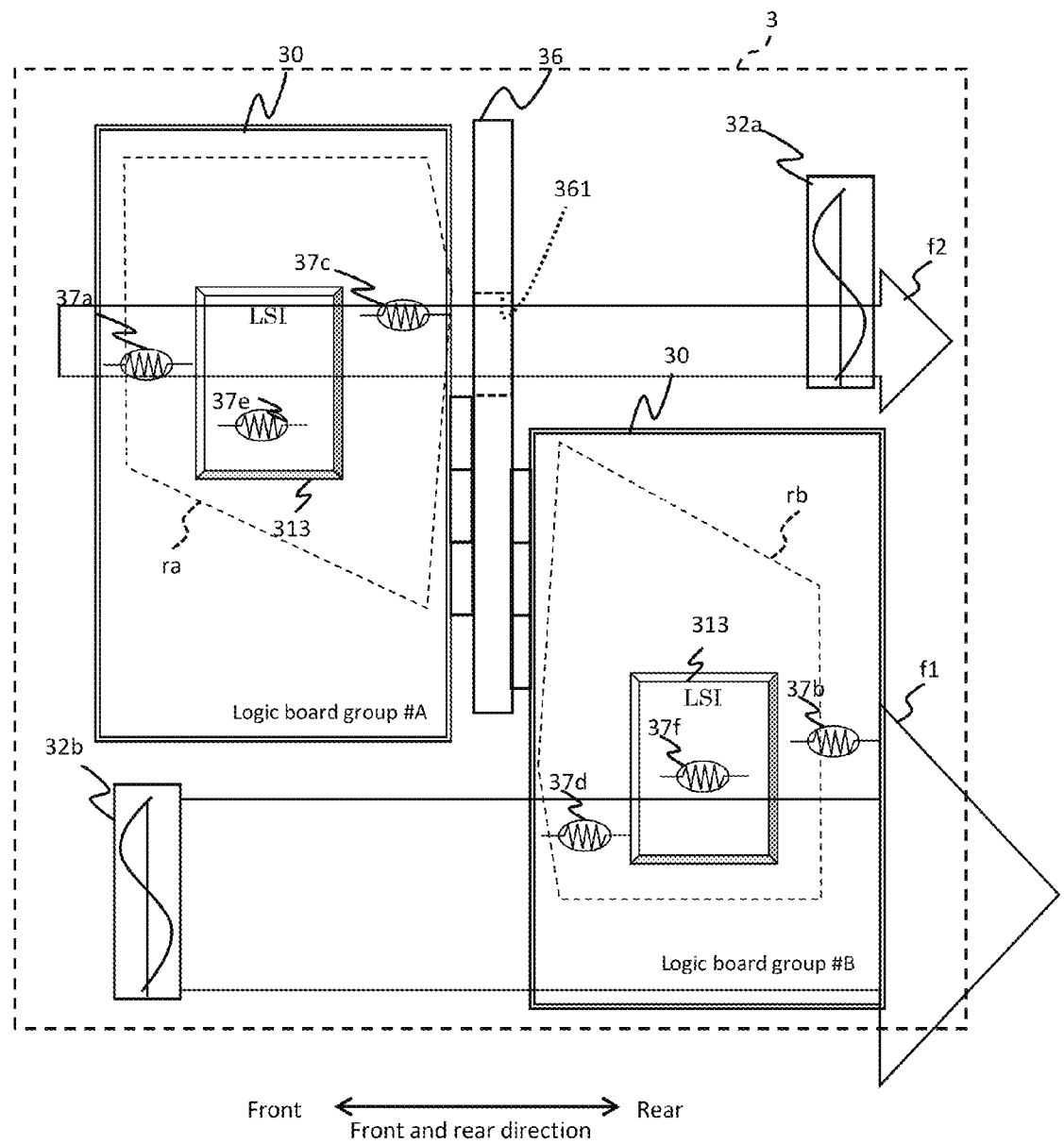
FIG. 19 is a view for explaining a cooling range of the logic module of FIG. 18.

According to the embodiment, temperature sensors 37a and 37c are respectively installed on a front side and on a rear side of the part 313, and a temperature sensor 37e is installed also at the part 313 of the logic board 31 in each of the logic boards 31 configuring the logic board group #A. Also, temperature sensors 37d and 37b are respectively installed on a front side and on a rear side of the part 313, and a temperature sensor 37f is installed also at the part 313 of the logic board 31 also in each of the plurality of logic boards 31 configuring the logic board group #B. Temperature information (heat generating amounts) of the respective logic boards 31 configuring the respective logic board groups 30 can be measured by arranging the temperature sensors 37 in such a manner. Also, temperature information (heat generating amounts) of the individual logic boards 31 can be measured more accurately by installing the temperature sensors 37 at the parts 131 having much heat generation. Further, according to the embodiment, the temperature sensors 37a, 37e, and 37c are positioned in the flow path f1, and the temperature sensors 37d, 37f, and 37b are positioned in the flow path f2. Consequently, the temperature sensors 37a, 37e, and 37c are difficult to be influenced by the temperature of the logic board group #B, and the temperature sensors 37b, 37f, and 37d are difficult to be influenced by the temperature of the logic board group #A. Further, as shown in FIG. 19, the temperature sensors 37a, 37e, and 37c may be arranged at inside of the flow path f2 and an area ra at a vicinity of the flow path f2 in an area above the logic board 31 in the logic board group #A. Further, the temperature sensors 37d, 37f, and 37b may be arranged at inside of the flow path f1 and an area rb at a vicinity of the flow path f1 in an area above the logic board 31 in the logic board group #B. Consequently, temperatures of the area ra and the portion rb which are liable to be influenced by the cooling winds can be measured further accurately.

Figure 20:
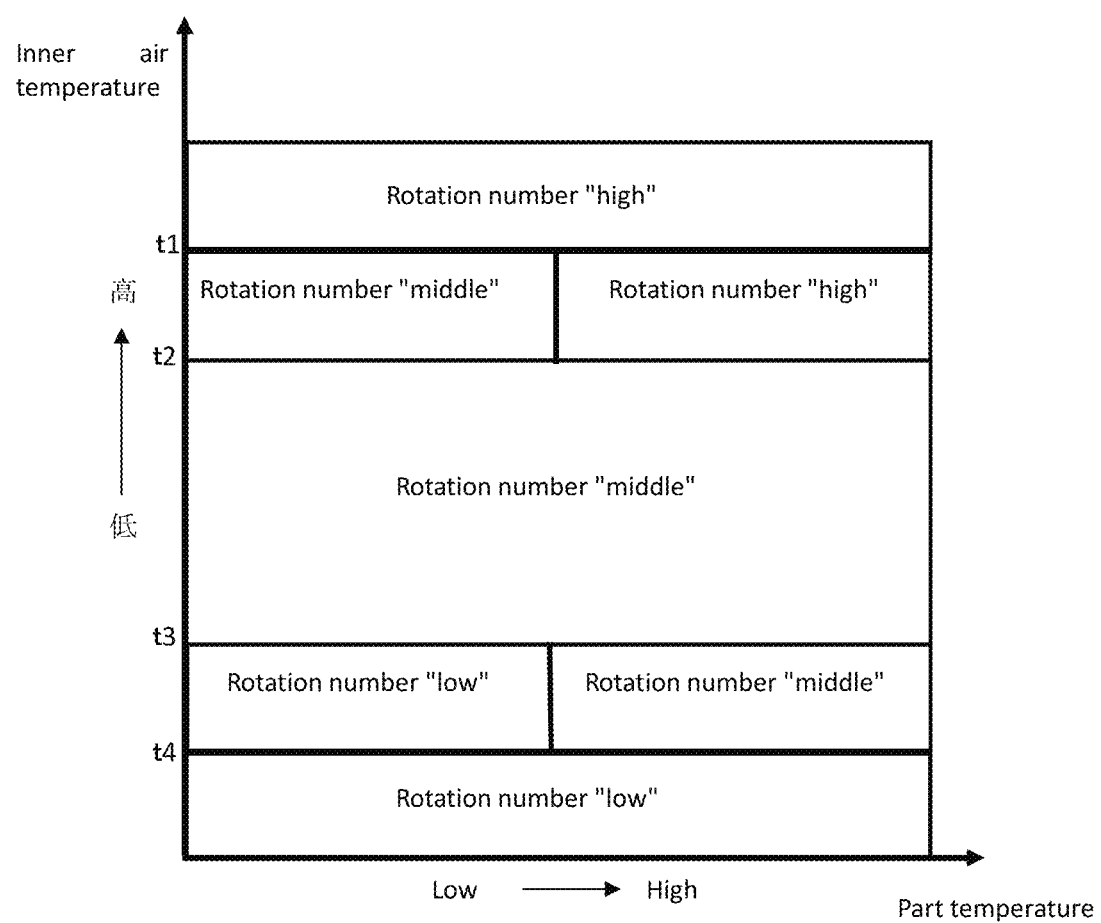
FIG. 20 is a diagram for explaining a temperature control of Example 3.

In a case of installing the temperature sensors 37 to the parts 313 as in the embodiment, for example, the rotation number of the fan 32 may be controlled as in FIG. 20. For example, temperatures of the respective logic board groups 30 (hereinafter, referred to as inner air temperatures) can be estimated by the temperature sensors installed on front sides and on rear sides of the parts 313 on the respective logic boards 31. Also, heat generating amounts (hereinafter, referred to as part temperatures) of the logic boards 31 can be measured by the temperature sensors 37 installed at the parts 313 of the respective logic boards 31. Consequently, the MP 62 can control the rotation number of the fan 32 based on the inner air temperature and the part temperature. A specific explanation will be given of the control methods as follows.

For example, an explanation will be given of a case where four thresholds t1, t2, t3, and t4 of the inner air temperature are configured in an order of a higher inner temperature, and a range of a fan rotation number is configured as "high", "middle", and "low" in an order of a higher range of the rotation number. In a case where the inner temperature is equal to or higher than t1, or in a case where the inner temperature is equal to or lower than t4, the rotation number is determined only by the inner air temperature. Specifically, in the case where the inner temperature is equal to or higher than t1, the rotation number of the fan 32 is configured to "high", in a case where the inner temperature is equal to or higher than t3 and lower than t2, the rotation number of the fan 32 is configured to "middle", and in a case where the inner air temperature is equal to or lower than t4, the rotation number of the fan 32 is configured to "low". Also, in a case where the inner temperature is equal to or higher than t2 and lower than t1, or in a case where the inner temperature is higher than t4 and equal to or lower than t3, the rotation number is determined by the inner air temperature and the part temperature. Specifically, in a case where the inner temperature is equal to or higher than t2 and lower than t1, and the part temperature is equal to or higher than a prescribed temperature, the fan rotation number is configured to "high", and in a case where the inner air temperature is equal to or higher than t2 and lower than t1 and the part temperature is lower than the prescribed temperature, the fan rotation number is configured to "middle". Also, in a case where the inner air temperature is higher than t4 and equal to or lower than t3, and the part temperature is equal to or higher than the prescribed temperature, the fan rotation number is configured to "middle". Also, in a case where the inner air temperature is higher than t4 and equal to or lower than t3, and the part temperature is equal to or higher than the prescribed temperature, or in a case where there is not mounting information in the configuration, the fan rotation number is configured to "low". Further, when the fan a1 is being exchanged, cooling of the logic board number A1 may be assisted by rotating the fans a2, b1, and b2 at high speeds.

Example 4

Example 4 will be explained as follows. In that case, an explanation will be given mainly on a point of a difference from Examples 1 through 3, and the explanation will be omitted or simplified concerning a point common to Example 1.

FIG. 21 is a view for explaining a wiring structure of a back-plane of Example 4.

In the embodiment, a high speed wiring area HSA is configured at a vicinity of the connector 363 within a valid wiring area VA. Specifically, for example, the high speed wiring area HSA coupling the plurality of connectors 363 is provided at a center portion of the valid wiring area VA, and a low speed wiring area LSA having a transmission rate lower than that of the high speed wiring area is provided to detour the high speed wiring area at a peripheral edge portion of the valid wiring area VA. Consequently, a loss of a signal can be reduced by making the high speed wiring portion shorter than the low speed wiring portion.

Although the explanation has been given of the one embodiment and modified examples thereof as described above, this invention is not limited to the embodiment and the modified examples, but can naturally be modified variously within the range not deviated from the gist.

Incidentally, the technique explained in the embodiment described above can also be expressed as follows. In the cooling structure of this invention, a first circuit board corresponds to the logic board 31 or the like in the logic board group #A, a first fan corresponds to the fan 32b or the like, and a connection board corresponds to the back-plane 36. Also, a second circuit board corresponds to the logic board 31 or the like in the logic board group #B, and a second fan corresponds to the fan 32a or the like. Further, a first temperature sensor corresponds to the temperature sensor 37a or the like, a second temperature sensor corresponds to the temperature sensor 37c, a third temperature sensor corresponds to the temperature sensor 37b, a fourth temperature sensor corresponds to the temperature sensor 37e, and a fifth temperature sensor corresponds to the temperature sensor 37f.

REFERENCE SIGNS LIST

1 Storage system 1
2 Storage module
3 Logic module
30 Logic board group
31 Logic board
32 Fan
36 Back-plane
37 Temperature sensor

The invention claimed is:

1. A cooling mechanism comprising:
a plurality of first circuit boards arranged in parallel with each other;
a plurality of first fans configured to generate a cooling wind in a first flow path formed along the plurality of first circuit boards;
a connection board arranged orthogonally to the first flow path and at a position different from a position of the first flow path, and configured to couple the plurality of first circuit boards;
a plurality of second circuit boards arranged in parallel with each other and coupled by the connection board, and on an opposite side of the connection board, to the plurality of first circuit boards; and
one or more second fans configured to generate a cooling wind in a second flow path formed at a position different from the position of the first flow path and along the plurality of second circuit boards,
wherein the plurality of first fans face the first flow path and are disposed side by side in parallel with an aligning direction of the plurality of first circuit boards, and wherein a cross section of the first flow path orthogonal to a flow direction of the first flow path is wider than a cross section of the second flow path orthogonal to a flow direction of the second flow path.

2. The cooling mechanism according to claim 1, wherein the one or more second fans are a plurality of second fans that face the second flow path and are disposed side by side in parallel with an aligning direction of the plurality of second circuit boards.

3. The cooling mechanism according to claim 2, wherein the plurality of first fans are arranged on an opposite side of the connection board to the plurality of first circuit boards, and configured to blow the cooling wind into the first flow path, and
the plurality of second fans are arranged on an opposite side of the connection board to the plurality of second circuit boards, and configured to suck the cooling wind from the second flow path.

4. The cooling mechanism according to claim 2, wherein a first board, which is at least one of the plurality of second circuit boards, includes a first heat generating part, and a first temperature sensor and a second temperature sensor are respectively attached to the first heat generating part on an upstream side and on a downstream side of the cooling wind in the second flow path, and
a second board, which is at least one of the plurality of first circuit boards, includes a second heat generating part, and a third temperature sensor is attached to the second heat generating part on the downstream side of the cooling wind in the first flow path, and
the cooling mechanism further comprises:
a first control unit configured to control a downstream fan, out of the plurality of second fans, which is positioned on the downstream side of the cooling wind in the second flow path relative to the first board, in accordance with a first temperature based on measured values of the first temperature sensor and the second temperature sensor; and
a second control unit configured to control an upstream fan, out of the plurality of first fans, which is positioned on the upstream side of the cooling wind in the first flow path relative to the second board, in accordance with a second temperature based on measured values of the second temperature sensor and the third temperature sensor.

5. The cooling mechanism according to claim 4, wherein a fourth temperature sensor is attached to a vicinity of the first heat generating part,
a fifth temperature sensor is attached to a vicinity of the second heat generating part,
the first control unit controls the downstream fan in accordance with the first temperature and a temperature measured by the fourth temperature sensor, and
the second control unit controls the upstream fan in accordance with the second temperature and a temperature measured by the fifth temperature sensor.

6. The cooling mechanism according to claim 1, wherein the one or more second fans are a plurality of second fans that face the second flow path and are disposed side by side in parallel with an aligning direction of the plurality of second circuit boards, and
the connection board is arranged orthogonally to the second flow path and at a position different from a position of the second flow path.

7. The cooling mechanism according to claim 1, wherein the connection board includes:

a plurality of connectors respectively coupled to the plurality of first circuit boards;

a connection wiring area including a wiring portion coupling the plurality of connectors; and a low speed wiring area arranged on the outside of the connection wiring area and including a wiring portion having a transmission rate lower than a transmission rate of the connection wiring area.

8. An information processing apparatus comprising:

an enclosure;

a plurality of first circuit boards arranged in parallel with each other in the enclosure;

a plurality of first fans configured to generate a cooling wind in a first flow path formed along the plurality of first circuit boards in the enclosure;

a connection board fixed in the enclosure, arranged orthogonally to the first flow path and at a position different from a position of the first flow path, and configured to couple the plurality of first circuit boards;

a plurality of second circuit boards arranged in parallel with each other in the enclosure and coupled by the connection board, and on an opposite side of the connection board, to the plurality of first circuit boards; and one or more second fans configured to generate a cooling wind in a second flow path formed at a position different from the position of the first flow path and along the plurality of second circuit boards in the enclosure, wherein the plurality of first fans face the first flow path and are disposed side by side in parallel with an aligning direction of the plurality of first circuit boards, wherein a cross section of the first flow path orthogonal to a flow direction of the first flow path is wider than a cross section of the second flow path orthogonal to a flow direction of the second flow path, and wherein at least one of the plurality of first circuit boards includes a control unit configured to control the first fans.

9. The information processing apparatus according to claim 8, wherein the one or more second fans are a plurality of second fans that face the second flow path and are disposed side by side in parallel with an aligning direction of the plurality of second circuit boards.

10. The information processing apparatus according to claim 9, wherein the plurality of first fans are arranged on an opposite side of the connection board to the plurality of first circuit boards, and configured to blow the cooling wind into the first flow path, and the plurality of second fans are arranged on an opposite side of the connection board to the plurality of second circuit boards, and configured to suck the cooling wind from the second flow path.

11. The information processing apparatus according to claim 9, wherein a first board, which is at least one of the plurality of second circuit boards, includes a first heat generating part, and a first temperature sensor and a second temperature sensor are respectively attached to the first heat generating part on an upstream side and on a downstream side of the cooling wind in the second flow path, and a second board, which is at least one of the plurality of first circuit boards, includes a second heat generating part, and a third temperature sensor is attached to the second heat generating part on the downstream side of the cooling wind in the first flow path, and the information processing apparatus further comprises:

a first control unit configured to control a downstream fan, out of the plurality of second fans, which is positioned on the downstream side of the cooling wind in the second flow path relative to the first board, in accordance with a first temperature based on measured values of the first temperature sensor and the second temperature sensor; and a second control unit configured to control an upstream fan, out of the plurality of first fans, which is positioned on the upstream side of the cooling wind in the first flow path relative to the second board, in accordance with a second temperature based on measured values of the second temperature sensor and the third temperature sensor.

12. The information processing apparatus according to claim 11, wherein a fourth temperature sensor is attached to a vicinity of the first heat generating part, a fifth temperature sensor is attached to a vicinity of the second heat generating part, the first control unit controls the downstream fan in accordance with the first temperature and a temperature measured by the fourth temperature sensor, and the second control unit controls the upstream fan in accordance with the second temperature and a temperature measured by the fifth temperature sensor.

13. The information processing apparatus according to claim 8, wherein the one or more second fans are a plurality of second fans that face the second flow path and are disposed side by side in parallel with an aligning direction of the plurality of second circuit boards, and the connection board is arranged orthogonally to the second flow path and at a position different from a position of the second flow path.

14. The information processing apparatus according to claim 8, wherein the connection board includes:

a plurality of connectors respectively coupled to the plurality of first circuit boards;

a connection wiring area including a wiring portion coupling the plurality of connectors; and a low speed wiring area arranged on the outside of the connection wiring area and including a wiring portion having a transmission rate lower than a transmission rate of the connection wiring area.

* * * * *